United States Patent
Mohammadi et al.

(10) Patent No.: US 9,190,269 B2
(45) Date of Patent: Nov. 17, 2015

(54) SILICON-ON-INSULATOR HIGH POWER AMPLIFIERS

(71) Applicant: Purdue Research Foundation, West Lafayette, IN (US)

(72) Inventors: Saeed Mohammadi, Zionsville, IN (US); Sultan R. Helmi, West Lafayette, IN (US); Jing-Hwa Chen, West Lafayette, IN (US); Hossein Pajouhi, West Lafayette, IN (US)

(73) Assignee: PURDUE RESEARCH FOUNDATION, West Lafayette, IN (US)

( * ) Notice: Subject to any disclaimer, the term of this patent is extended or adjusted under 35 U.S.C. 154(b) by 53 days.

(21) Appl. No.: 13/797,111

(22) Filed: Mar. 12, 2013

(65) Prior Publication Data

US 2013/0307626 A1 Nov. 21, 2013

Related U.S. Application Data

(60) Continuation-in-part of application No. 13/733,889, filed on Jan. 4, 2013, now Pat. No. 8,558,619, which is a division of application No. 13/044,989, filed on Mar. 10, 2011, now Pat. No. 8,368,469.

(60) Provisional application No. 61/312,288, filed on Mar. 10, 2010.

(51) Int. Cl.
| | |
|---|---|
| *H03F 3/16* | (2006.01) |
| *H03F 3/14* | (2006.01) |
| *H01L 21/02* | (2006.01) |
| *H03F 3/21* | (2006.01) |
| *H03F 3/42* | (2006.01) |
| *H03F 3/45* | (2006.01) |
| *H03F 1/02* | (2006.01) |
| *H01L 27/12* | (2006.01) |

(52) U.S. Cl.
CPC ........ *H01L 21/0254* (2013.01); *H01L 27/1203* (2013.01); *H03F 1/0272* (2013.01); *H03F 3/21* (2013.01); *H03F 3/426* (2013.01); *H03F 3/45179* (2013.01); *H03F 2200/537* (2013.01); *H03F 2203/45394* (2013.01); *H03F 2203/45731* (2013.01)

(58) Field of Classification Search
CPC ..................................... H03F 3/14; H03F 3/16
USPC .................................. 330/277, 307, 296, 285
See application file for complete search history.

(56) References Cited

U.S. PATENT DOCUMENTS

| | | | | |
|---|---|---|---|---|
| 6,906,401 | B2* | 6/2005 | Dunn et al. | 257/623 |
| 2010/0006857 | A1* | 1/2010 | Letertre | 257/76 |
| 2011/0095335 | A1* | 4/2011 | Ishida et al. | 257/190 |
| 2011/0195560 | A1* | 8/2011 | Gaudin et al. | 438/459 |
| 2012/0028440 | A1* | 2/2012 | Castex et al. | 438/459 |
| 2012/0228711 | A1* | 9/2012 | Hoshino | 257/368 |
| 2013/0154088 | A1* | 6/2013 | Cable et al. | 257/737 |

* cited by examiner

*Primary Examiner* — Henry Choe
(74) *Attorney, Agent, or Firm* — Purdue Research Foundation

(57) ABSTRACT

Illustrative embodiments of power amplifiers and associated methods are disclosed. In at least one embodiment, a method may include fabricating a power amplifier in a first silicon layer of a silicon-on-insulator (SOI) substrate, wherein the SOI substrate comprises the first silicon layer, a second silicon layer, and a buried oxide layer disposed between the first and second silicon layers; removing at least some of the second silicon layer from the SOI substrate, after fabricating the power amplifier; and securing the SOI substrate, after removing at least some of the second silicon layer, to an electrically non-conductive and thermally conductive substrate.

9 Claims, 23 Drawing Sheets

SILICON-ON-INSULATOR HIGH POWER AMPLIFIERS

CROSS-REFERENCE TO RELATED APPLICATIONS

This is a continuation-in-part application of U.S. patent application Ser. No. 13/733,889, filed on Jan. 4, 2013, which is a divisional application of U.S. patent application Ser. No. 13/044,989, filed on Mar. 10, 2011, now U.S. Pat. No. 8,368, 469, which in turn claimed priority to U.S. Provisional Patent Application Ser. No. 61/312,288, filed on Mar. 10, 2010. The entire disclosures of each of the foregoing applications are hereby incorporated by reference.

STATEMENT REGARDING FEDERALLY SPONSORED RESEARCH

This invention was made with government support under Grant No. FA8650-10-1-7053 awarded by the Defense Advanced Research Projects Agency. The government has certain rights in the invention.

TECHNICAL FIELD

The present disclosure generally relates to power amplifiers, which may be used in transmitter modules for wireless communication devices and radars, by way of example. More particularly, the present disclosure relates to circuit design topologies and methodologies in which electrically isolated, complimentary metal-oxide-silicon (CMOS) transistors are stacked in series and biased using unique dynamic biasing approaches.

BACKGROUND

Scaling and other advances in silicon (Si) technology have brought about compact, high-performance SiGe bipolar and CMOS transistors and various radio frequency (RF), microwave, and mm-wave circuits implemented in Si technology. Si is an ideal technology for implementing an entire electronic system, as the various components of the system (e.g., digital, analog, memory, and RF components) can be integrated on a single substrate or chip. One bottleneck for Si-based, single-chip design in many applications is the implementation of a high-performance power amplifier.

While the feasibility of Si-based power amplifiers on a Si substrate has recently been demonstrated, commercially available designs provide relatively low output power and low-efficiency performance ("efficiency" being defined herein as the ratio of RF output power to the direct-current (DC) power dissipated by the circuit). The relatively poor performance of Si-based power amplifiers has been attributed to an inherent trade-off between the speed of a Si transistor and its breakdown voltages. As a result of this trade-off, high-speed Si transistors optimized for RF and microwave applications have relatively low breakdown voltages (e.g., ranging from about 1.2V to several volts). The output swing voltage of a Si power transistor is typically limited by the low breakdown voltage of the transistor, requiring an increase in the output signal current in order to boost the output power. Traditionally, the design of Si-based power amplifiers has been accomplished using wide transistors driven at very high currents. Parallel combinations of large transistors and power-combining architectures have also typically been necessary to boost the output power of the amplifier.

Some power amplifier designs relying on series-stacked transistors have been proposed. For example, J. Jeong et al., "A 20 dBm Linear RF Power Amplifier Using Stacked Silicon-on-Sapphire MOSFETs," 16 IEEE Microwave & Wireless Components Letters 684-686 (2006) describes the use of stacked transistors in Silicon-on-Sapphire (SOS) and Silicon-on-Insulator (SOI) technologies to boost the output swing voltage and output impedance. S. Pornpromlikit et al., "A Watt-Level Stacked-FET Linear Power Amplifier in Silicon-on-Insulator CMOS," 58 IEEE Transactions on Microwave Theory & Techniques 57-64 (2010) describes a similar approach. As explained in those references, the gate of each transistor is biased at a fixed voltage, and the voltage swings are therefore limited by the gate oxide breakdown. This limitation prevents stacking more than four transistors and/or applying large bias voltages.

U.S. Pat. No. 6,888,396 to A. Hajimiri et al. (Hajimiri) presents several designs for stacking field-effect transistors (FET) and bipolar transistors to construct multi-cascode cells. The majority of the circuit designs described in Hajimiri are fixed gate-bias topologies and suffer from the drawbacks of gate oxide breakdown described above. The design presented in FIG. 9 of Hajimiri utilizes transformer coupling to overcome gate oxide breakdown but does not allow biasing of the gate-source of individual transistors (thus, resulting in low efficiency and precluding use in linear power amplifiers). The circuit design shown in FIG. 7 of Hajimiri, on the other hand, requires diodes that are not readily available in standard bulk and silicon-on-insulator (SOI) CMOS integrated circuit processes (thus, defeating the goal of a single substrate, without resort to a BiCMOS process).

The use of feedback resistors for the self-biasing of stacked FETs and bipolar transistors (in order to boost the output voltage of the amplifier) is described in J. G. McRory et al., "Transformer Coupled Stacked FET Power Amplifiers," 34 IEEE J. Solid-State Circuits 157-161 (1999), M. Lei et al., "Design and Analysis of Stacked Power Amplifier in Series-Input and Series-Output Configuration," 55 IEEE Transactions on Microwave Theory & Techniques 2802-2812 (2007), and U.S. Patent Publication No. 2009/0115529 to S. Chao et al. In theory, this approach protects the stacked structure from both source-drain reach-through and gate oxide breakdown under high voltage swings. In practice, however, introducing feedback resistors results in instability, particularly when the number of stacked transistors increases (thereby increasing the positive feedback signal). Thus, these designs are limited to a maximum of four stacked transistors, as a stack of more than four common-source transistors will be unstable unless the gain is reduced to very low values.

SUMMARY

The present invention comprises one or more of the features recited in the appended claims and/or the following features which, alone or in any combination, may comprise patentable subject matter:

According to one aspect, a method may comprise fabricating a power amplifier in a first silicon layer of a silicon-on-insulator (SOI) substrate, wherein the SOI substrate comprises the first silicon layer, a second silicon layer, and a buried oxide layer disposed between the first and second silicon layers, removing at least some of the second silicon layer from the SOI substrate, after fabricating the power amplifier, and securing the SOI substrate, after removing at least some of the second silicon layer, to an electrically non-conductive and thermally conductive substrate.

In some embodiments, securing the SOI substrate to the electrically non-conductive and thermally conductive substrate may comprise securing the SOI substrate to an aluminum nitride (AlN) substrate. Removing at least some of the second silicon layer may comprise removing all of the second silicon layer from the SOI substrate, and securing the SOI substrate to the AlN substrate comprises securing the buried oxide layer of the SOI substrate to the AlN substrate. Securing the SOI substrate to the AlN substrate may comprise bonding the SOI substrate to the AlN substrate using an adhesive layer. Securing the SOI substrate to the AlN substrate may comprise depositing AlN on a side of the SOI substrate opposite the power amplifier. Depositing AlN on the side of the SOI substrate opposite the power amplifier may comprise depositing AlN using pulsed laser deposition.

In some embodiments, the method may further comprise attaching the first silicon layer to a handling wafer using photoresist, after fabricating the power amplifier and prior to removing at least some of the second silicon layer. Removing at least some of the second silicon layer may comprise dry etching the second silicon layer using xenon difluoride.

In some embodiments, the power amplifier may comprise a plurality of transistors formed in the first silicon layer of the SOI substrate such that the plurality of transistors are each electrically isolated from one another within the SOI substrate and a plurality of biasing networks, each biasing network being configured to dynamically bias at least one of the plurality of transistors, wherein the plurality of transistors are electrically coupled in a series stack and an output of the power amplifier is provided across the series stack. The power amplifier may comprise a plurality of cascode amplifier cells each including at least two of the plurality of transistors, at least one transistor of each of the plurality of cascode amplifier cells being arranged in a common-gate configuration.

According to another aspect, a power amplifier may comprise a plurality of amplifier cells, each of the plurality of amplifier cells comprising (i) a first transistor that is arranged in a common-source configuration and (ii) a feedback resistor configured to dynamically bias the first transistor, and a first cascode amplifier cell comprising (i) a second transistor that is arranged in a common-source configuration, (ii) a third transistor that is arranged in a common-gate configuration, and (iii) a first biasing network configured to dynamically bias the second and third transistors, wherein the first transistors, the second transistor, and the third transistor are electrically coupled in a series stack, an output of the power amplifier being provided across the series stack.

In some embodiments, the first transistors, the second transistor, and the third transistor may be formed on a silicon-on-insulator (SOI) substrate such that the first transistors, the second transistor, and the third transistor are each electrically isolated from one another within the SOI substrate. The second and third transistors may be positioned in the series stack such that the second and third transistors are subjected to higher swing voltages than the first transistors.

In some embodiments, the power amplifier may further comprise a second cascode amplifier cell comprising (i) a fourth transistor that is arranged in a common-source configuration, (ii) a fifth transistor that is arranged in a common-gate configuration, and (iii) a second biasing network configured to dynamically bias the fourth and fifth transistors, wherein the fourth transistor and the fifth transistor are also electrically coupled in the series stack. The second, third, fourth, and fifth transistors may be positioned in the series stack such that the second, third, fourth, and fifth transistors are subjected to higher swing voltages than the first transistors.

In some embodiments, one of the plurality of amplifier cells that is nearest an input of the power amplifier may further comprise one of a resistor and an inductor that is electrically coupled between a gate terminal of the first transistor and an independent bias voltage. The first cascode amplifier cell may further comprise a fourth transistor that is arranged in a common-gate configuration, where the first biasing network is also configured to dynamically bias the fourth transistor and the fourth transistor is also electrically coupled in the series stack. At least one of the first transistors, the second transistor, and the third transistor may comprise a plurality of transistor fingers, a temperature sensor configured to detect a junction temperature of one of the plurality of transistor fingers, and a body terminal configured to stabilize a local threshold voltage of the one of the plurality of transistor fingers in response to the junction temperature exceeding a threshold value.

According to yet another aspect, a power transistor may comprise a plurality of transistor fingers, a temperature sensor configured to detect a junction temperature of one of the plurality of transistor fingers, and a body terminal configured to stabilize a local threshold voltage of the one of the plurality of transistor fingers in response to the junction temperature exceeding a threshold value. In some embodiments, each of the plurality of transistor fingers may be positioned adjacent one temperature sensor and one body terminal.

BRIEF DESCRIPTION OF THE DRAWINGS

The concepts described in the present disclosure are illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. The detailed description particularly refers to the accompanying figures in which.

DETAILED DESCRIPTION OF THE DRAWINGS

Figure 1A:
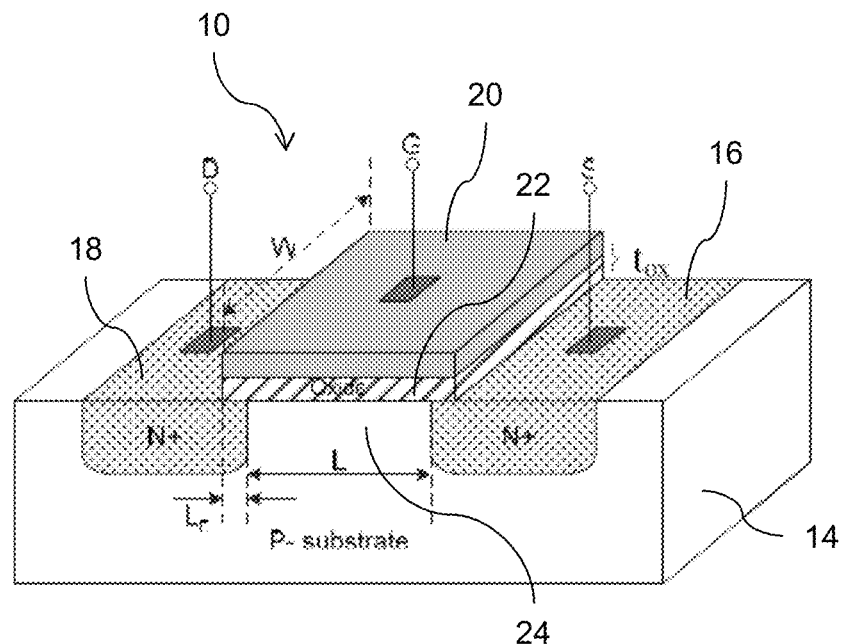
FIG. 1A illustrates one embodiment of a bulk CMOS transistor.

While the concepts of the present disclosure are susceptible to various modifications and alternative forms, specific exemplary embodiments thereof have been shown by way of example in the drawings and will herein be described in detail. It should be understood, however, that there is no intent to limit the concepts of the present disclosure to the particular forms disclosed, but, on the contrary, the intention is to cover all modifications, equivalents, and alternatives falling within the spirit and scope of the invention as defined by the appended claims.

In the following description, numerous specific details, such as types and interrelationships of circuit components, are set forth in order to provide a more thorough understanding of the present disclosure. It will be appreciated, however, by one skilled in the art that embodiments of the disclosure may be practiced without such specific details. In other instances, various circuit components have not been shown in detail (or not labeled in every instance) in order not to obscure the invention. Those of ordinary skill in the art, with the included descriptions, will be able to implement appropriate functionality without undue experimentation.

References in the specification to "one embodiment," "an embodiment," "an illustrative embodiment," etcetera, indicate that at least one embodiment described may include a particular feature, structure, or characteristic, but not every embodiment necessarily includes the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described.

Figure 1B:
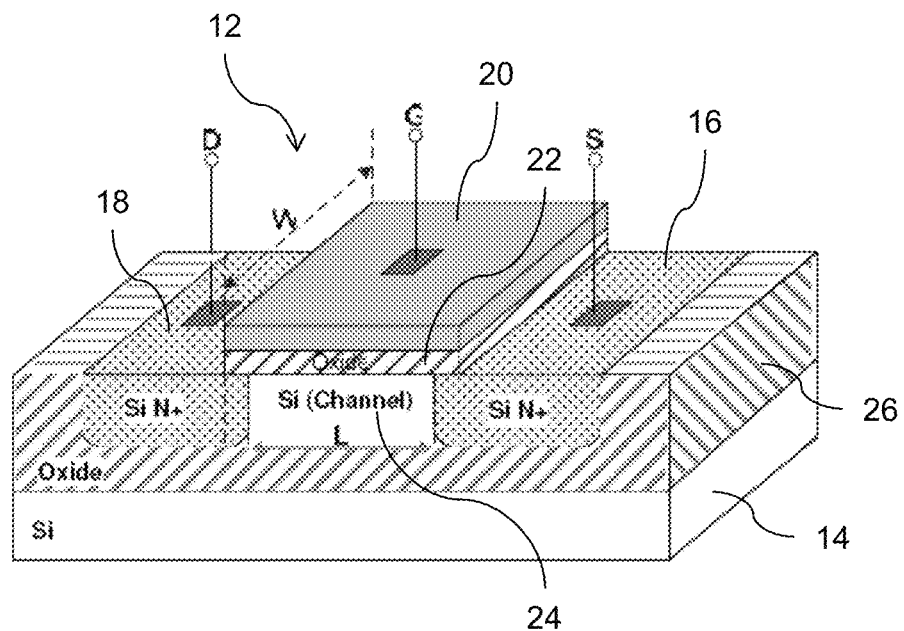
FIG. 1B illustrates one embodiment of an electrically isolated SOI CMOS transistor.

Exemplary CMOS transistors 10, 12 are illustrated in FIGS. 1A and 1B, each generally including a body 14, a source region 16, a drain region 18, a gate 20, a gate oxide 22, and a channel region 24. The transistor 10 (shown in FIG. 1A) is fabricated using a bulk CMOS process in which the source and drain regions 16, 18 are formed in electrical contact with the body 14. By contrast, the transistor 12 (in FIG. 1B) is fabricated using a silicon-on-insulator (SOI) CMOS process in which the source and drain regions 16, 18 are formed on a very thin Si layer isolated from the bulk Si body 14 by a buried oxide (BOX) layer 26. Additionally or alternatively, oxide trenches may be formed around each transistor 12 to achieve electrical isolation from one another. As a result of the BOX layer 26 (and/or the oxide trenches), the transistor 12 is electrically isolated not only from the body 14 but also from any neighboring devices (i.e., other transistors 12). It is contemplated that, in other embodiments, the electrical isolation of transistor 12 may be achieved through trench isolation (which may be implemented as a post-processing step) or other appropriate processes.

Generally, in CMOS technology, the length (L) of the transistor channel 24 and the thickness ($t_{OX}$) of the gate oxide 22 are scaled down to improve the transconductance and the speed of the transistors 10, 12, while reducing parasitic capacitances. Such scaling, however, has the adverse effect of reductions in the breakdown voltage ($BV_{OX}$) of gate oxide 22 and in the source-drain reach-through voltage ($BV_{DS}$). The additional two voltage limitations in the bulk CMOS transistor 10 are the reverse-junction breakdown voltage (BV), which sets a limit on both the source-body voltage ($BV_{jS-B}$) and the drain-body voltage ($BV_{jD-B}$), and the forward-bias drain-body voltage ($V_{jFWD}$), which sets a limit on the negative voltage that can be applied to either the drain region 18 or the source region 16 with respect to the body 14. For standard, digital CMOS technology, the two dominant breakdown mechanisms are $BV_{OX}$ and $BV_{DS}$ (which are often optimized to be similar to one another), while $BV_j$ and $V_{jFWD}$ are, to the first degree, not affected by scaling. A standard 0.25 μm bulk CMOS process may produce an illustrative transistor 10 with $BV_{OX}$=2.7V, $BV_{DS}$=3.0V, $BV_j$=10.5V, and $V_{jFWD}$=−1V.

When attempting to use bulk CMOS technology under a high voltage swing, several transistors 10 may be stacked in series. While this approach overcomes the small source-drain reach-through voltage for each CMOS transistor, it fails to improve power performance, as other breakdown mechanisms (e.g., $BV_j$), continue to limit the maximum drain voltage of the transistor 10. Due to the insulating nature of the BOX layer 26 (or the other isolation techniques described above), however, the SOI CMOS transistor 12 does not suffer from low $BV_j$ and $V_{jFWD}$. Thus, any number of electrically isolated transistors 12 may be stacked in series without practical limitation (for instance, up to the breakdown voltage of the BOX layer 26).

According to the present disclosure, electrically isolated transistors 12 (such as the SOI CMOS transistor 12, by way of illustrative example) are stacked in series using a unique topology that not only prevents premature gate oxide breakdown but also results in stable operation. As described herein, a relatively large number of stacked transistors 12 may be individually biased with dynamic biasing techniques to better isolate the input and output of the stacked amplifier circuit and, thus, prevent the amplifier from self-oscillation. These dynamic biasing techniques protect against premature gate oxide breakdown of the individual transistors 12 in the stack when large voltage swings are applied across the series combination. The number of transistors 12 that can be stacked is limited primarily by the BOX layer 26 breakdown voltage, which is typically between about 80V to about 300V. For a given output power, an increase in the output swing voltage of a stack with a large number of transistors facilitates a reduction in the signal current of each transistor. Utilizing oversized transistors 12 with relatively small currents improves the efficiency of the amplifier.

Figure 2:
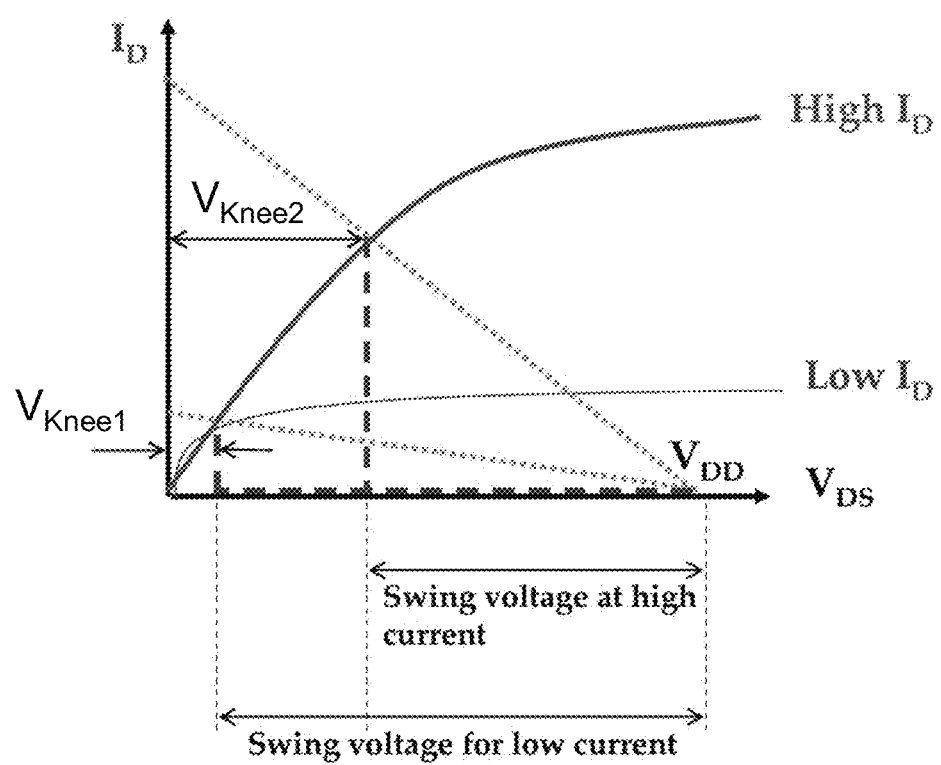
FIG. 2 illustrates how biasing individual transistors in a series-connected power amplifier at relatively low or relatively high currents can impact efficiency.

These principles may be best understood with reference to FIG. 2. As shown therein, a relatively small current (Low $I_D$) flowing in a transistor results in a relatively small knee voltage ($V_{Knee1}$). When the same transistor is driven at a relatively large current (High $I_D$), the knee voltage ($V_{Knee2}$) increases substantially, resulting in a smaller output voltage swing. The maximum power added efficiency (PAE) of a single transistor is limited to $\eta_{Knee}=[(V_{MAX}-V_{Knee})/V_{MAX}]^2$, where $V_{MAX}$ is the maximum voltage swing (typically, close to the breakdown voltage of the transistor). The breakdown voltage of GaAs and GaN transistors are often very high compared to their knee voltages, resulting in $\eta_{Knee}$ ratios approaching unity, and GaAs and GaN power amplifiers often achieve high PAEs.

Si-based transistors operating at high currents, on the other hand, are limited by their relatively small breakdown voltages and typically demonstrate $\eta_{Knee}$ ratios on the order of about 50% to about 90%. More advanced Si technologies often provide even lower $\eta_{Knee}$ ratios for power transistors, due to the inherent tradeoff between the breakdown voltage and the speed of a transistor. Thus, for advanced Si technologies, the only possibility to improve the $\eta_{Knee}$ ratio (e.g., to about 90%) is to drive a relatively large transistor at a relatively small drain current. As described herein, the stacking of SOI CMOS transistors 12 can be used to increase the overall output swing voltage and keep the output power relatively high.

In addition, the series stacking of transistors 12 may substantially reduce, or even eliminate, another PAE limiting mechanism: the power transfer ratio of impedance transformers ($\eta_{Transformer}$). The power transfer ratio of an impedance transformer depends on the losses of passive components and transmission lines and is typically in the range of about 50% to about 90%. In some embodiments, the use of a stacked transistor topology in SOI technology allows the elimination of impedance transformers all together. Instead, the overall impedance of the stack (i.e., the output impedances of the stacked transistors 12 added together) may be adjusted to 50Ω at the frequency of interest by optimizing the size and the number of transistors in the stack. By contrast, a 50Ω impedance environment cannot be achieved by designs based on parallel combination of transistors (due to their large effective capacitance), bringing down the equivalent impedance of the power amplifier at high frequencies and necessitating the use of an impedance transformer.

Figure 3A:
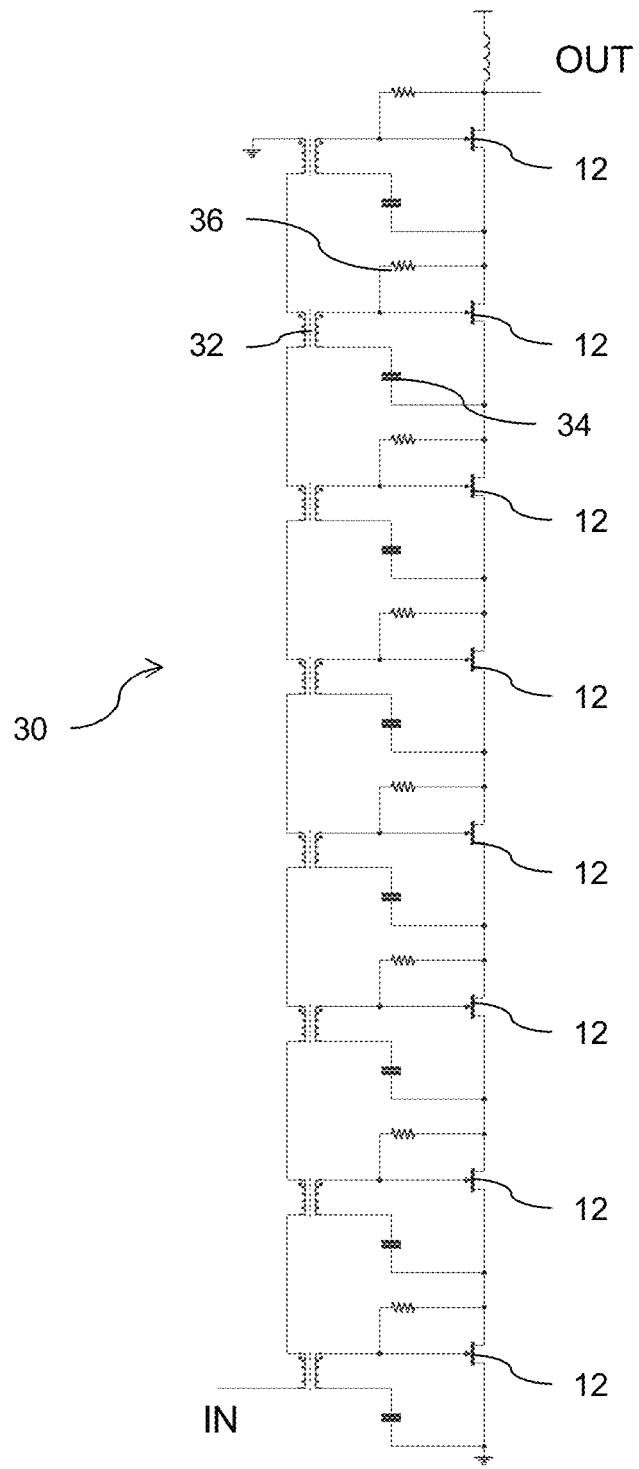
FIG. 3A illustrates one embodiment of a power amplifier including electrically isolated, dynamically biased common-source transistors.

Now referring to FIG. 3A, one illustrative embodiment of a power amplifier 30 includes eight dynamically biased, series stacked SOI CMOS transistors 12. In this embodiment, a transformer 32 couples the input signal to the gate of each stacked transistor 12. In other words, each stacked transistor 12 acts as an amplifier cell in the power amplifier 30. Although the power amplifier 30 shown in FIG. 3A uses a series-in configuration, it is also contemplated that other embodiments of the power amplifier may utilize parallel-in or a combination series-in/parallel-in configurations. Each of the stacked transistors 12 in the power amplifier 30 is arranged in a common-source configuration, with a capacitor 34 providing an AC ground with respect to the source of the transistor 12 at the end of the secondary winding of the transformer 32 that is not connected to the gate of the transistor 12. In this embodiment, each transistor 12 is dynamically biased by a feedback resistor 36 (i.e., each feedback resistor 36 provides the gate bias voltage of a corresponding transistor 12 from the source and drain voltages of that transistor 12).

Figure 3B:
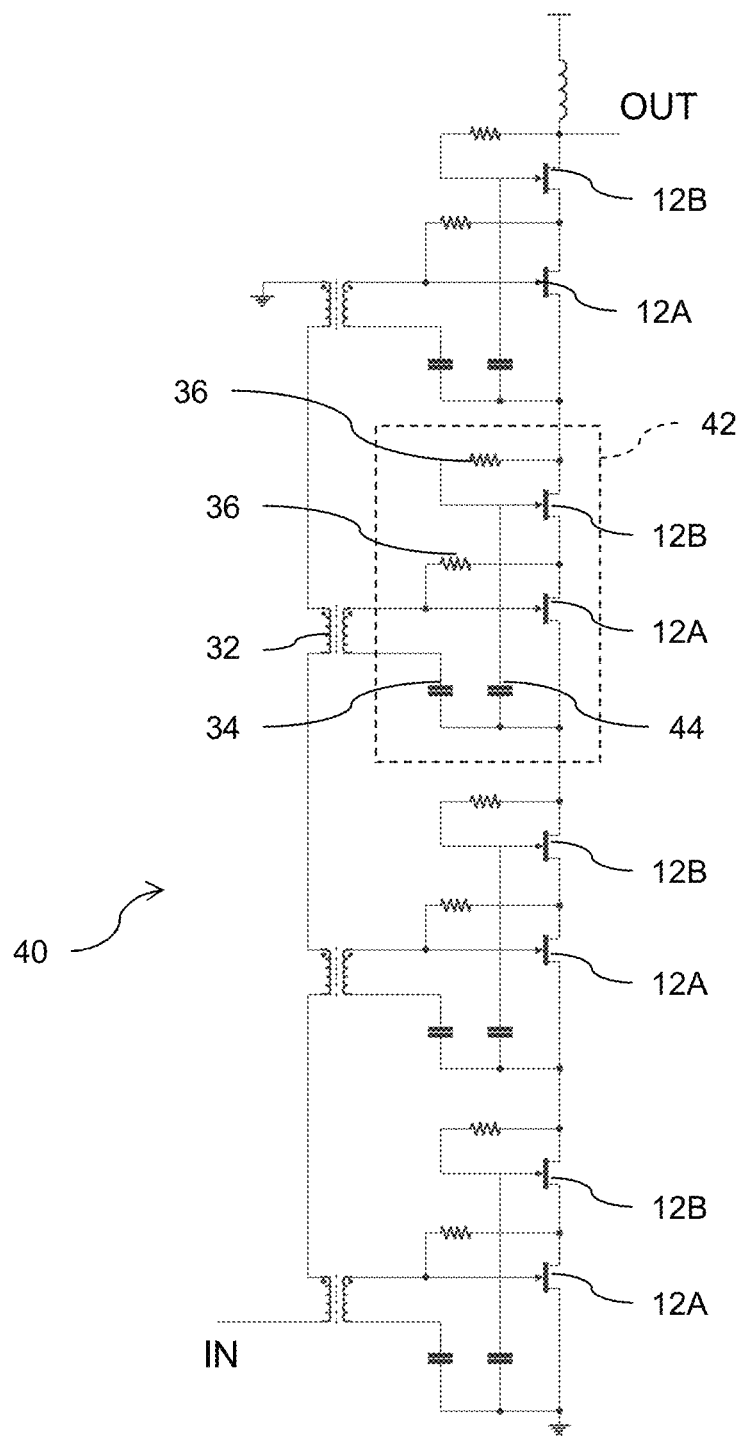
FIG. 3B illustrates one embodiment of a power amplifier including cascode cells with electrically isolated, dynamically biased transistors.

It will be appreciated that the embodiment of power amplifier 30 in FIG. 3A requires a number of transformers 32 that is equal to the number of stacked transistors 12. This large number of required transformers 32 may make the design bulky and unattractive. Additionally, this embodiment is more prone to instability due to the feedback resistors 36 used for dynamic biasing. FIG. 3B shows another illustrative embodiment of a power amplifier 40 that uses a number of stacked cascode amplifier cells 42 (instead of a common-source configuration for each transistor 12) to overcome these drawbacks. As can be seen in FIG. 3B, the power amplifier 40 uses half the number of transformers 32 of the power amplifier 30. As transformers formed on a Si substrate are often lossy, this embodiment provides higher gain and efficiency.

Figure 3C:
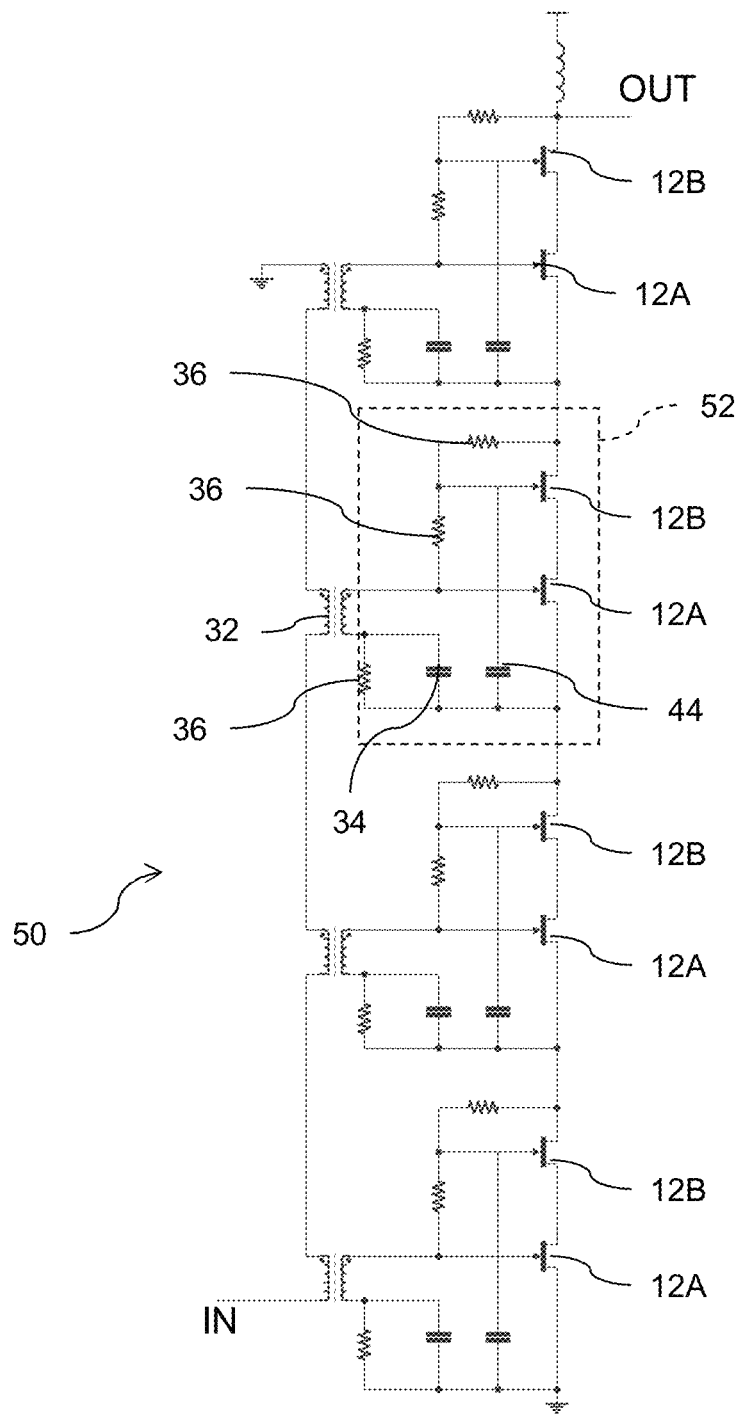
FIG. 3C illustrates another embodiment of a power amplifier including cascode cells with electrically isolated, dynamically biased transistors.

Each of the stacked cascode amplifier cells 42 of the power amplifier 40 includes two of the series stacked transistors 12A, 12B, each of which is dynamically biased by a feedback resistor 36. A capacitor 34 provides an AC ground with respect to the source of the transistor 12A at the end of the secondary winding of the transformer 32 that is not connected to the gate of the transistor 12A. A capacitor 44 provides an AC ground with respect to the source of transistor 12A at the gate of transistor 12B. In other words, the transistor 12A of each cascode amplifier cell 42 is arranged in a common-source configuration, while the transistor 12B of each cascode amplifier cell 42 is arranged in a common-gate configuration. FIG. 3C shows yet another illustrative embodiment of a power amplifier 50 that uses a number of stacked cascode amplifier cells 52 with a different dynamic biasing scheme. In this embodiment, instead of tapping the drain of each transistor 12A, 12B, only the drains of the common-gate transistors 12B are tapped with a network of feedback resistors 36 to provide dynamic biasing (i.e., the network of feedback resistors 36 provides the gate bias voltage of each transistor 12A, 12B of a cascode cell 52 from the source voltage of the transistor 12A and the drain voltage of the transistor 12B of that cascode cell 52).

Figure 3D:
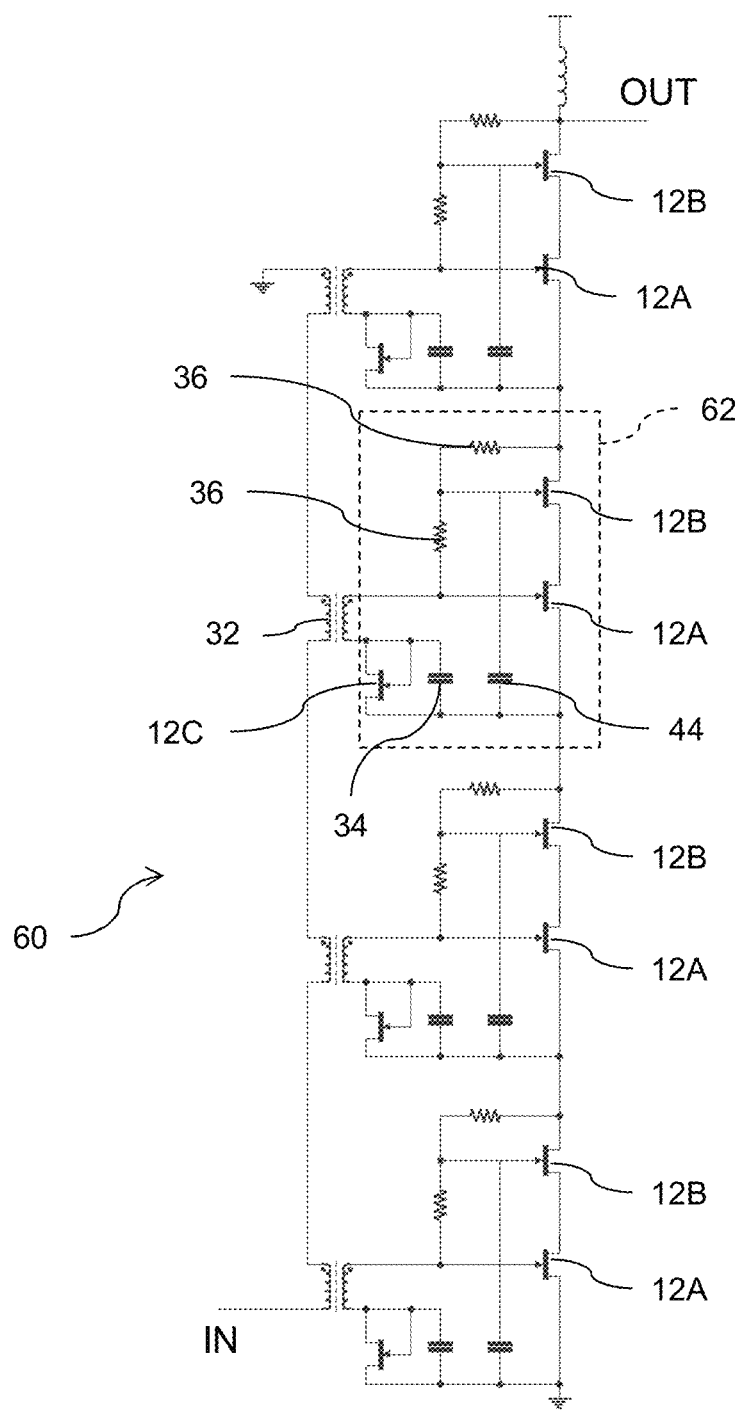
FIG. 3D illustrates yet another embodiment of a power amplifier including cascode cells with electrically isolated, dynamically biased transistors.

As shown in FIG. 3D, another illustrative embodiment of a power amplifier 60 may employ a number of stacked cascode amplifier cells 62 with yet another dynamic biasing scheme. In the cascode amplifier cells 62, a diode-connected transistor 12C provides DC biasing for the common-source transistor 12A. It is contemplated that, in some embodiments, transistor 12C may be a series stack of multiple diode-connected transistors, depending on the bias voltage required at the gate of transistor 12A. Like the cascode amplifier cell 52 shown in FIG. 3C, only the drain terminals of common-gate transistors 12B of the cascode amplifier cells 62 are tapped to provide dynamic biasing (through a network of feedback resistors 36 and the transistor 12C).

Figure 4:
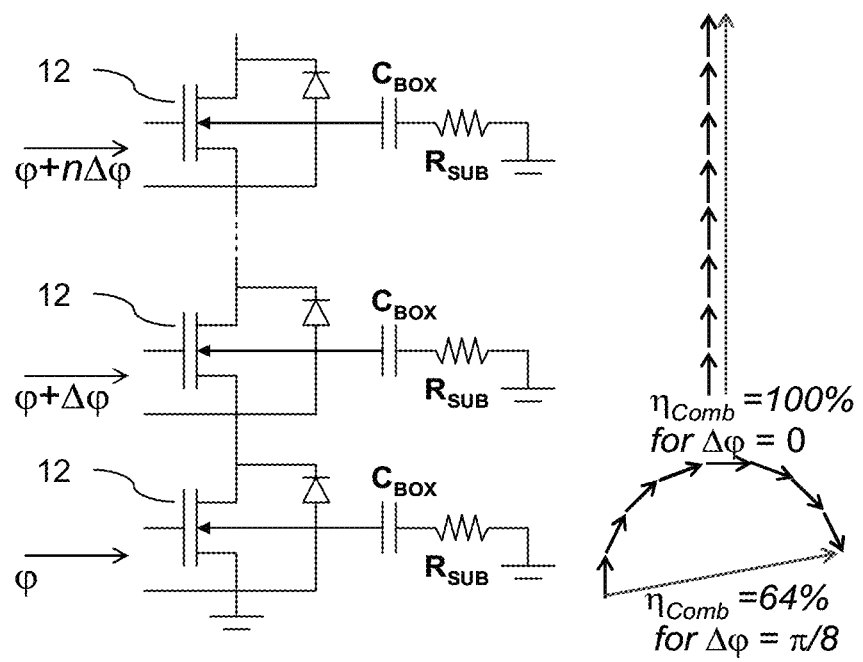
FIG. 4 illustrates an equivalent circuit of electrically isolated, dynamically biased transistors.

The use of dynamically biased, stacked SOI CMOS transistors 12 presents the additional challenge of ensuring that the output signals of the various amplifier cells are added together constructively. FIG. 4 depicts a simple equivalent circuit of the stacked transistors 12. As the transistors 12 are stacked on top of one another, the phase of the signals seen at the input of each transistor 12 should ideally be identical. In reality, because each transistor 12 has a parasitic capacitance to ground ($C_{BOX}$), the impedance seen at the input of each transistor 12 varies. As a result, the phases of the signal seen at the inputs of the transistors 12—which translate to the phase of signals added together at the output of the power amplifier—are not the same, and these signals do not add constructively. The right side of FIG. 4 illustrates the combining efficiencies for two different cases. When all phases are in sync and add constructively, the combining efficiency is 100%. When a phase difference exists among the stacked transistors 12 (illustrated as a constant phase difference of n/8 in FIG. 4), however, the combining efficiency drops to 64%. The combining efficiency sets an upper limit for the maximum PAE that can be achieved by a power amplifier. In addition, a phase imbalance may also result in the reduction of the output power for the same input power applied to the amplifier. While the phase difference is illustrated as constant in FIG. 4, the phase difference actually increases rather quadratically with the number of transistors 12. The issue of phase imbalance is another reason (in addition to the problem of breakdown voltages) that power amplifiers having more than four series stacked transistors have previously been unsuccessful.

Figure 5A:
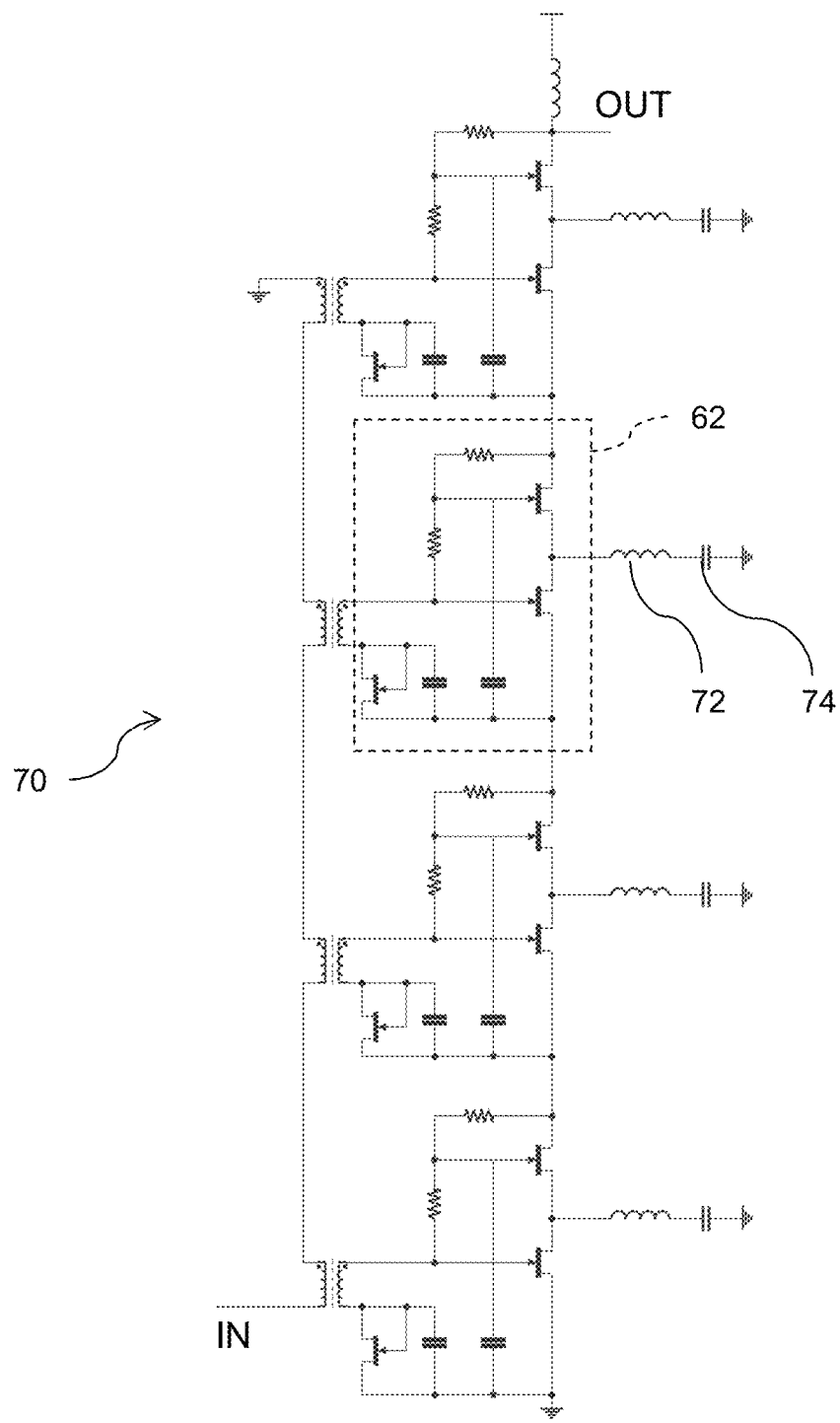
FIG. 5A illustrates one embodiment of a power amplifier that compensates for phase imbalance.
Figure 5B:
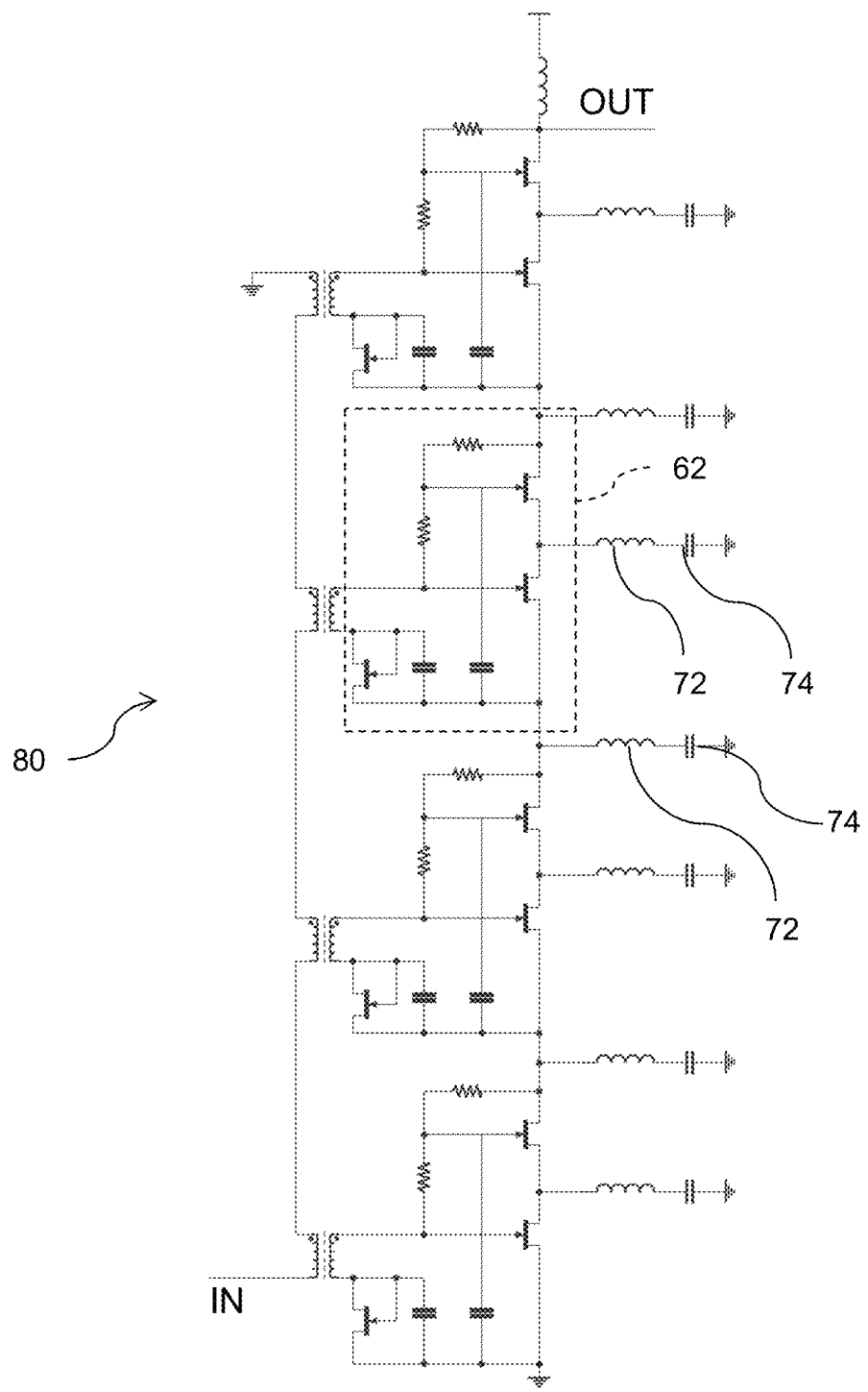
FIG. 5B illustrates another embodiment of a power amplifier that compensates for phase imbalance.

The illustrative embodiments of power amplifiers 70, 80 shown in FIGS. 5A and 5B demonstrate one approach to address the issue of parasitic capacitances (and any resulting phase imbalance). Although this approach is illustrated based on the embodiment of power amplifier 60 (of FIG. 3D), it should be appreciated that a similar approach could be applied to any of the other embodiments disclosed herein. The design of power amplifier 60 works well for lower frequencies and small transistor sizes, with small parasitic capacitances that result in small phase differences among the transistors 12. At higher frequencies and/or with larger transistors 12 (required to achieve high output powers), parasitic capacitances at the common node of the transistors 12A, 12B in each cascode amplifier cell 62 may introduce phase imbalance into power amplifier 60.

As shown in FIG. 5A, power amplifier 70 incorporates parallel inductors 72 to tune out such parasitic capacitances. An additional capacitor 74 (having a large capacitance with large breakdown voltage) may be added in series with each inductor 72 to maintain the DC bias, so as that the RF performance of the circuit is not affected. The inductors 72 tune out the parasitic capacitances and, thus, balance the phase among the transistors 12. As shown in FIG. 5B, power amplifier 80 incorporates parallel inductors 72 (with series capacitors 74) at every internal node of the stacked transistors 12. For reduced area and improved bandwidth, other power amplifier embodiments may use only one parallel inductor 72 and one series capacitor 74 connected to one of the internal nodes. Alternatively, in other embodiments, a transmission line network may be used in place of the inductor 72 and the capacitor 74. Another design consideration to balance the phase of the stacked transistors 12 is to provide the input signal and obtain the output signal at the opposite ends of the stack (as shown in FIGS. 3A-D and 5A-9). By feeding the stack at the bottom, phase delays due to physical length of input transformers 32 are (at least somewhat) compensated by phase delays due to physical distance among the output nodes.

Figure 6:
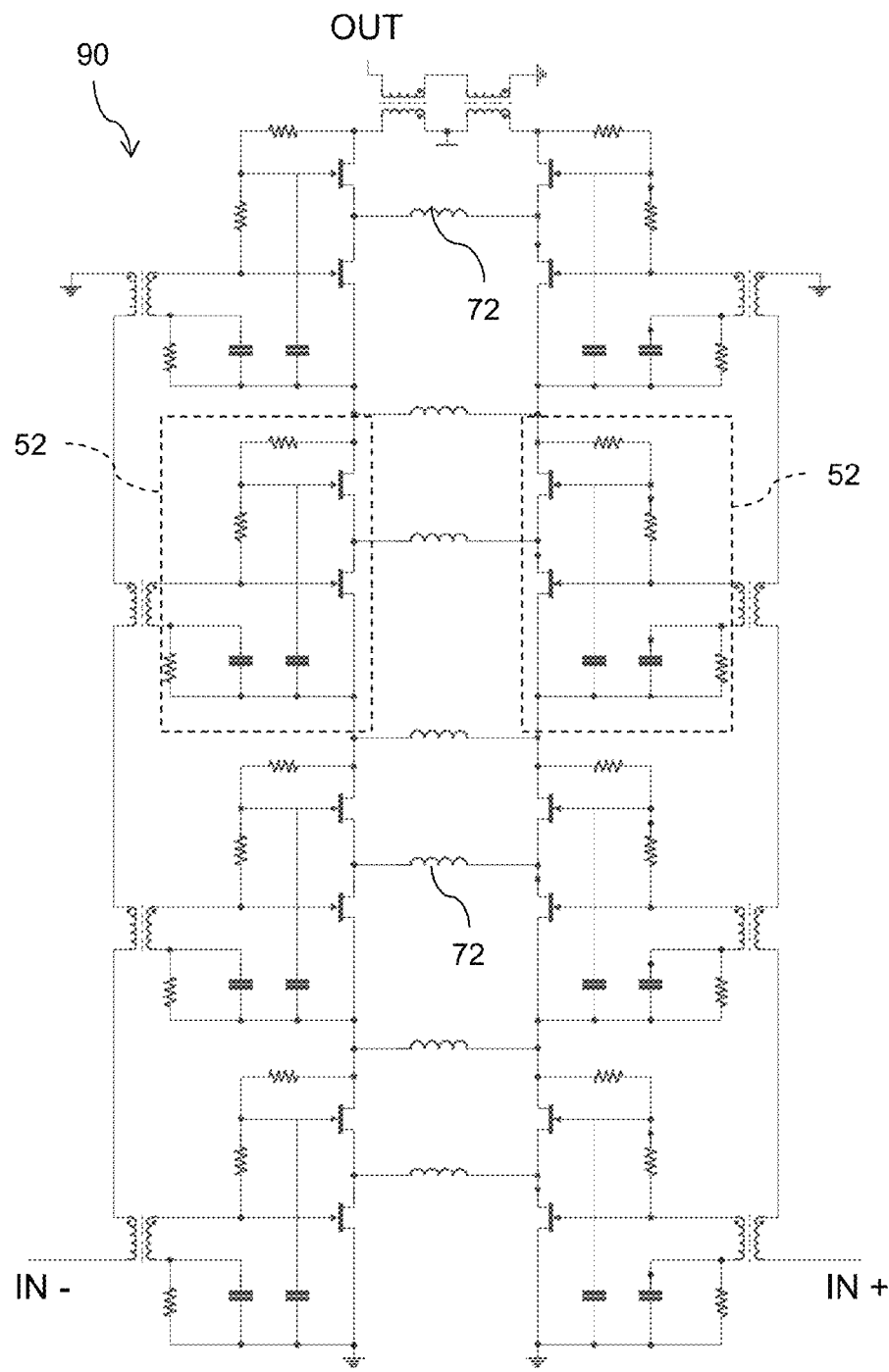
FIG. 6 illustrates one embodiment of a differential power amplifier.

One limitation of the embodiments shown in FIGS. 5A and 5B is the need for capacitors 74 with large capacitances and large breakdown voltage (especially the capacitor 74 that is connected to the top transistor 12 in the stack, which is subjected to the highest swing voltage). Such capacitors can be difficult to implement in Si-based technologies. Another illustrative embodiment of a power amplifier 90, shown in FIG. 6, is configured as a differential power amplifier (based on the embodiment of power amplifier 50 of FIG. 3C). In this embodiment, the inductors 72 extend between each pair of corresponding nodes on opposite sides of the differential power amplifier 90. In other embodiments, the inductors 72 may extend between only some (not all) of the pairs of corresponding nodes on opposite sides of the differential power amplifier 90. The differential design of power amplifier 90 eliminates the need to use high voltage capacitors 74. Once again, it should be appreciated that such a differential design could be applied to any of the embodiments disclosed herein.

Figure 7A:
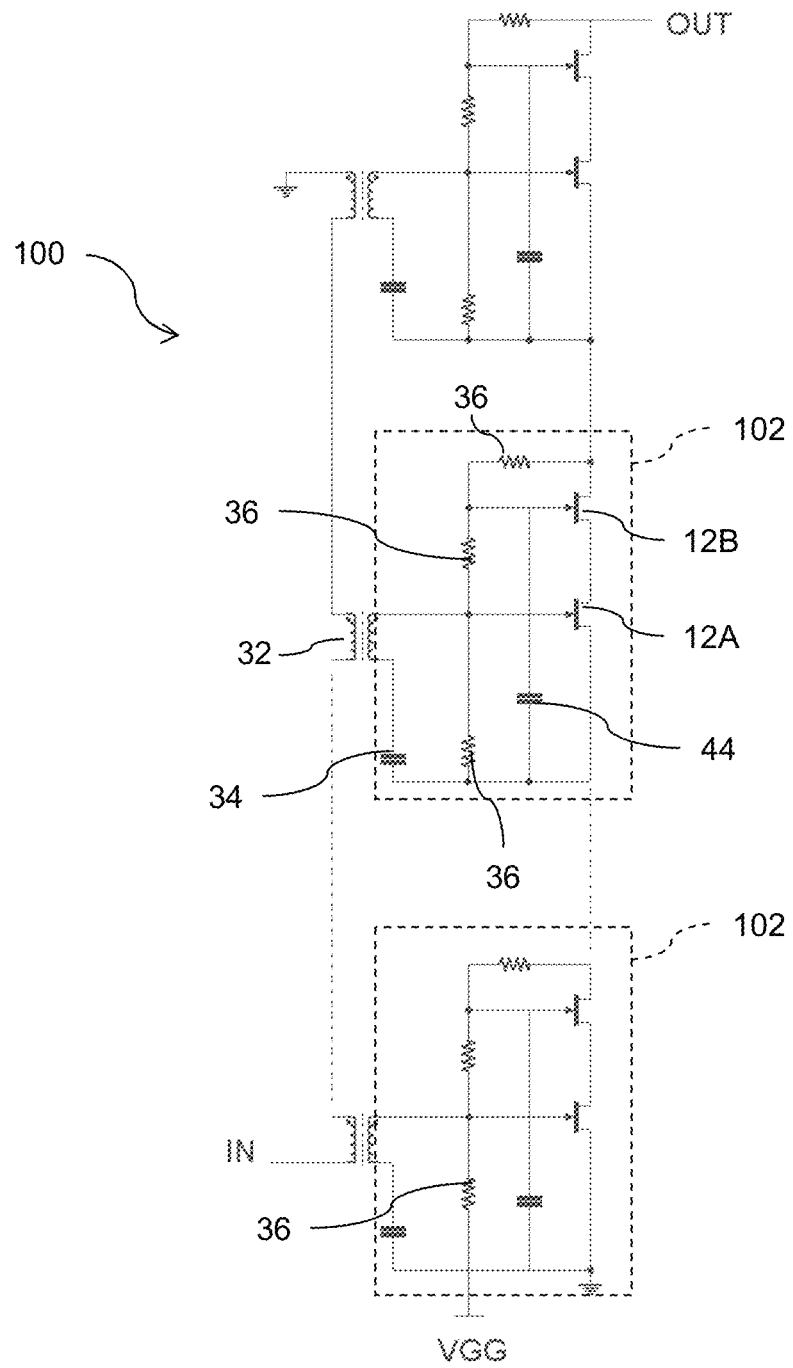
FIG. 7A illustrates one embodiment of a power amplifier that allows adjustment of drain current independent of drain supply voltage.
Figure 7B:
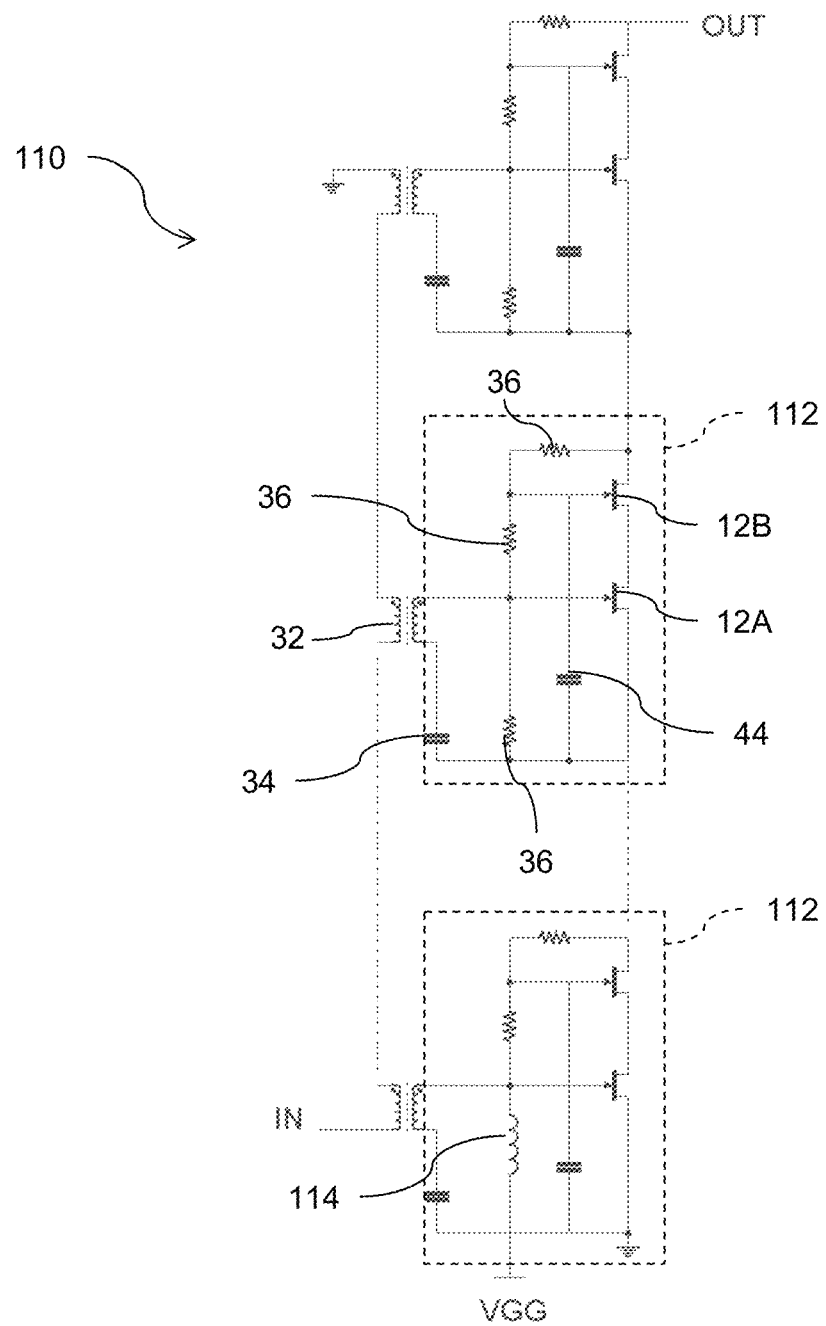
FIG. 7B illustrates another embodiment of a power amplifier that allows adjustment of drain current independent of drain supply voltage.

FIG. 7A shows another illustrative embodiment of a power amplifier 100 that uses a number of stacked cascode amplifier cells 102. Similar to the power amplifiers 40, 50, 60, 70, 80, 90 described above, each of the stacked cascode amplifier cells 102 of the power amplifier 100 includes a common-source transistor 12A and a common-gate transistor 12B. The transistors 12A, 12B of each cascode amplifier cell 102 are dynamically biased by a network of feedback resistors 36. In particular, each cascode amplifier cell 102 (except the cascode amplifier cell 102 nearest the input of the power amplifier 100) includes a first feedback resistor 36 coupled between the gate and drain terminals of the transistor 12B, a second feedback resistor 36 coupled between the gate terminal of the transistor 12A and the gate terminal of the transistor 12B, and a third feedback resistor 36 coupled between the gate and source terminals of the transistor 12A. The cascode amplifier cell 102 nearest the input of the power amplifier 100 has a similar biasing network, except that the third feedback resistor 36 is coupled between the gate terminal of the transistor 12A and an independent bias voltage (VGG). This design allows adjustment of the drain current of the power amplifier 100 independent of the drain supply voltage (providing reduced DC power dissipation and improved efficiency). Another illustrative embodiment of a power amplifier 110, shown in FIG. 7B, has a similar design to the power amplifier 100, except that the cascode amplifier cell 112 nearest the input of the power amplifier 110 uses an inductor 114 (instead of the third feedback resistor 36) to couple the gate terminal of the transistor 12A to the independent bias voltage (VGG).

Figure 8A:
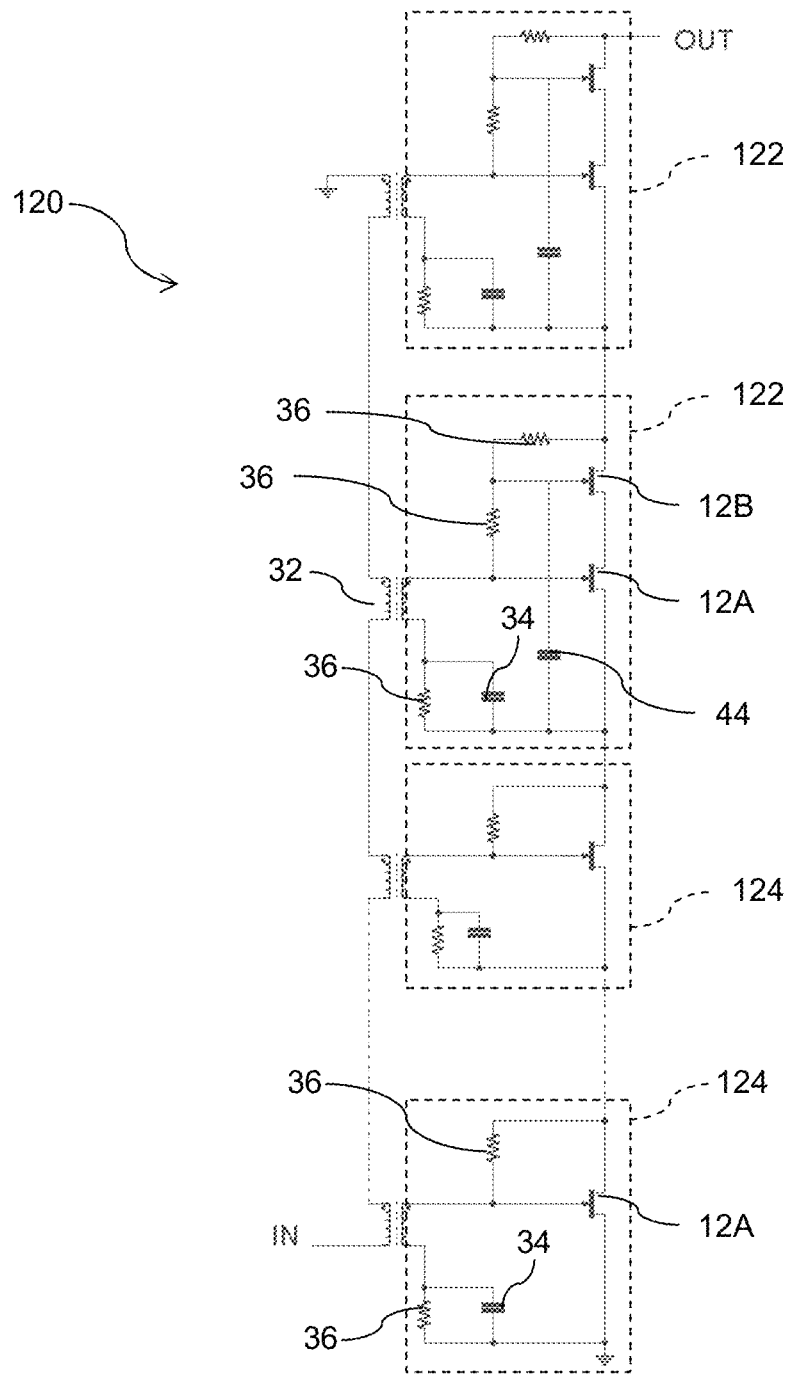
FIG. 8A illustrates one embodiment of a power amplifier including two cascode cells and a plurality of common-source cells (each including one or more electrically isolated, dynamically biased transistors)
Figure 8B:
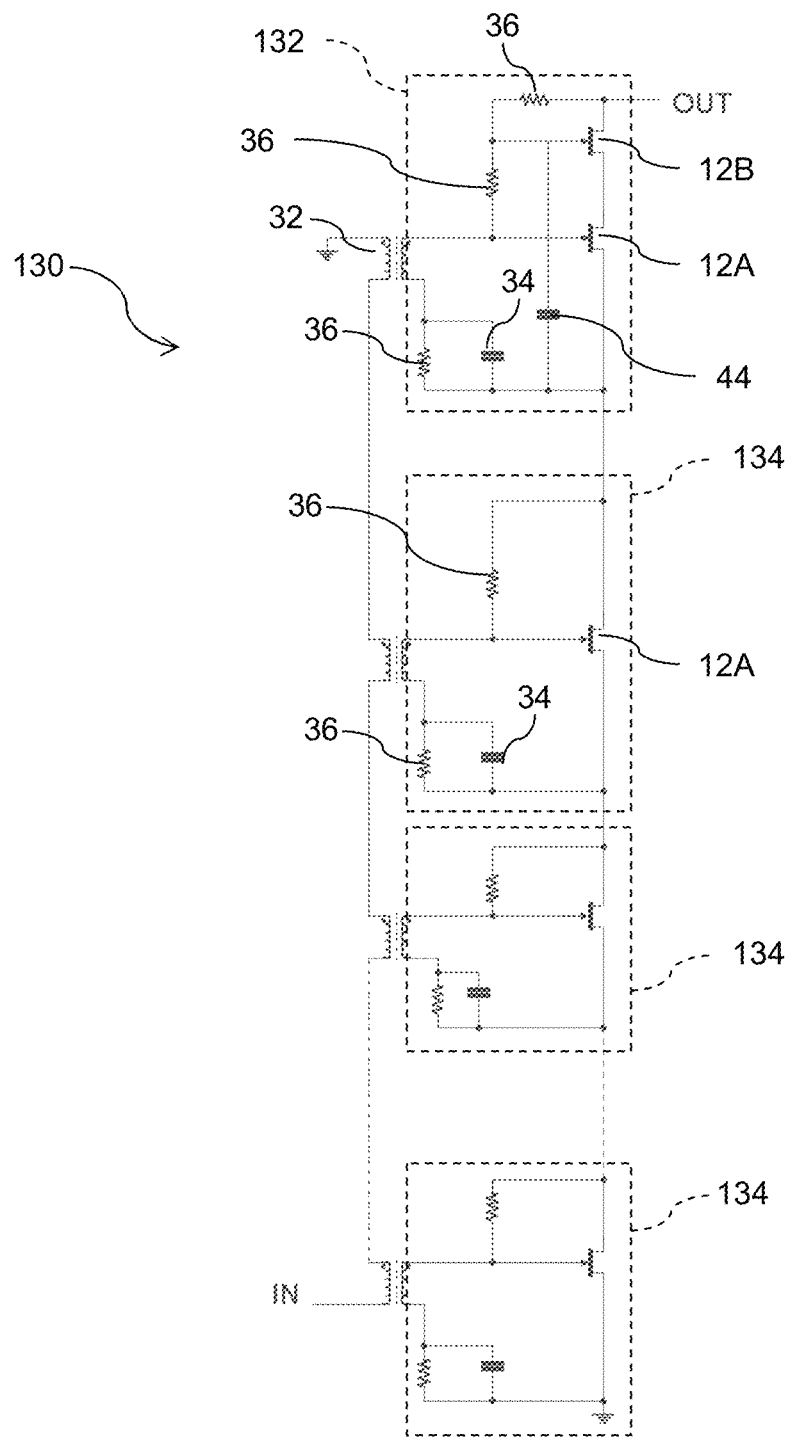
FIG. 8B illustrates one embodiment of a power amplifier including one cascode cell and a plurality of common-source cells (each including one or more electrically isolated, dynamically biased transistors)

Referring now to FIGS. 8A and 8B, respectively, illustrative embodiments of power amplifiers 120, 130 are shown that include one or more cascode amplifier cells 122, 132 and a plurality of common-source cells 124, 134, all arranged in a series stack. In particular, the power amplifier 120 includes two cascode amplifier cells 122 and two or more common-source amplifier cells 124 (while two common-source amplifier cells 124 are shown in FIG. 8A, it is contemplated that the power amplifier 120 may include any number of common-source amplifier cells 124). In the illustrative embodiment, both of the cascode amplifier cells 122 have a similar design to the cascode amplifier cells 52 of power amplifier 50 (shown in FIG. 3C), including a common-source transistor 12A, a common-gate transistor 12B, and a network of feedback resistors 36 that dynamically biases the transistors 12A, 12B. As shown in FIG. 8A, the cascode amplifier cells 122 are positioned in the series stack where the highest swing voltages are present. In the illustrative embodiment, each of the common-source amplifier cells 124 includes a common-source transistor 12A and a network of feedback resistors 36 that dynamically bias the common-source transistor 12A. The illustrative embodiment of power amplifier 130, shown in FIG. 8B, has a similar design to the power amplifier 120, except that only one cascode amplifier cell 132 (positioned in the series stack where the highest swing voltages are present) is utilized. The remainder of the series stack comprises common-source amplifier cells 134. The inclusion of the cascode amplifier cells 122, 132 in the power amplifiers 120, 130 promotes stability of the amplifier circuit.

Figure 9:
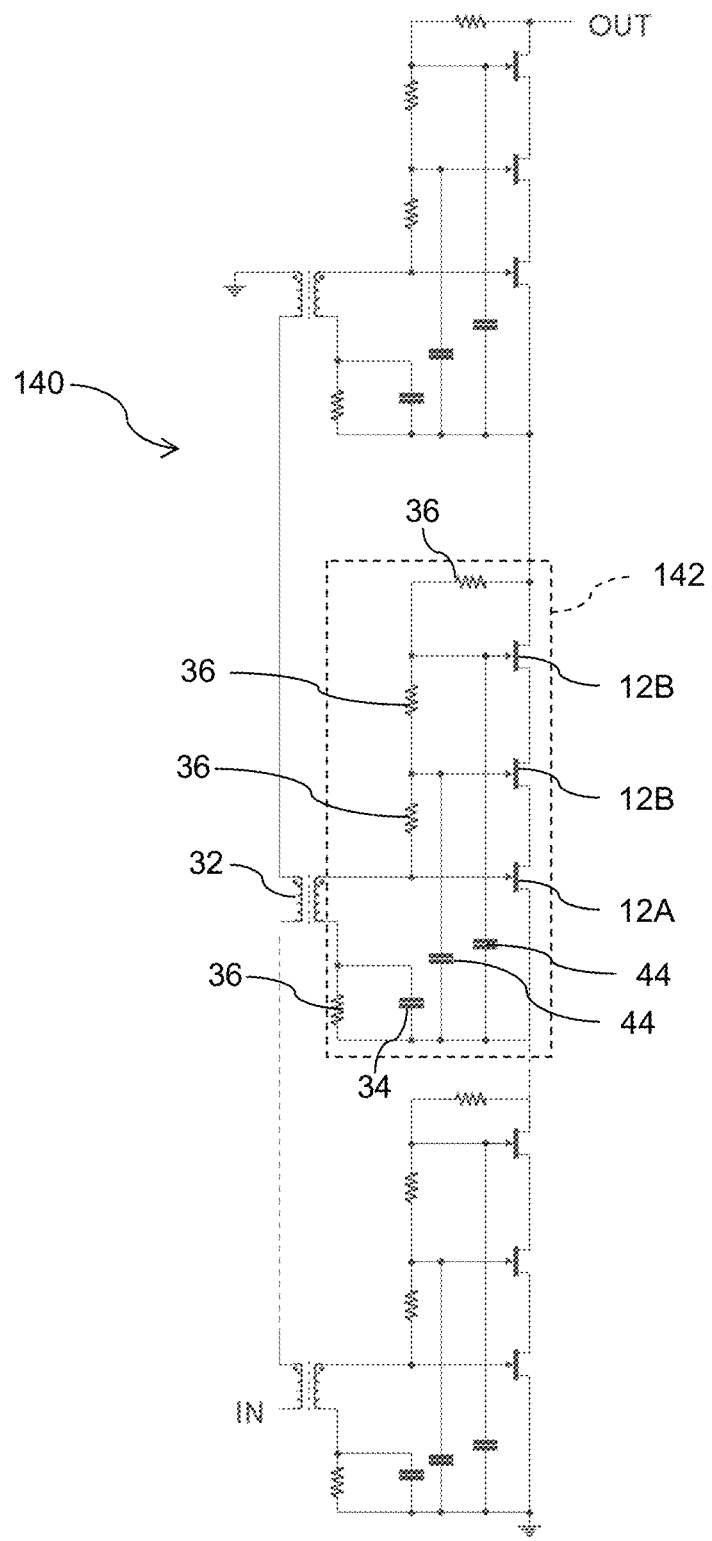
FIG. 9 illustrates one embodiment of a power amplifier including a plurality of cascode cells, each of the plurality of cascode cells including one electrically isolated, dynamically biased common-source transistor and a plurality of electrically isolated, dynamically biased common-gate transistors.

FIG. 9 shows another illustrative embodiment of a power amplifier 140 including a number of cascode amplifier cells 142, where each of the cascode amplifier cells 142 includes one common-source transistor 12A and two common-gate transistors 12B. It is contemplated that the power amplifier 140 may include any number of cascode amplifier cells 142 and that each cascode amplifier cell 142 may include any number of common-gate transistors 12B. The transistors 12A, 12B of each cascode amplifier cell 142 are dynamically biased by a network of feedback resistors 36. The design of the cascode amplifier cells 142 improves the gain of the power amplifier 140 while allowing for a reduced number of transformers 32. In particular, only one transformer 32 is used for each cascode amplifier cell 142 in the illustrative embodiment.

While the drawings of the present disclosure generally illustrate power amplifiers comprising six, eight, or nine stacked transistors 12, it is contemplated that any number of stacked transistors may be used in practice (as indicated, for example, by the dashed lines in FIGS. 7A-9). By way of illustrative example, between about two and about eighty transistors 12 may be used in each series stack. As previously mentioned, the only practical limit in stacking the transistors 12 is the breakdown voltage of the BOX layer 26, which should remain greater than the overall swing voltage of the amplifier. Those of skill in the art will recognize that increasing the thickness of the BOX layer 26 will allow more transistors to be stacked. In other embodiments, the backside Si substrate (i.e., body 14) may be partially removed using deep reactive ion etching (DRIE) at locations where RF transistors with high voltage exist.

The illustrative designs of power amplifiers 30, 40, 50, 60, 70, 80, 90, 100, 110, 120, 130, 140 disclosed herein may be applied to the design of power amplifiers in a wide range of frequencies, including, but not limited to, audio frequencies, RF, and mm-wave. The size and number of transistors 12 are among some of the parameters that may be optimized for particular applications. Illustrative embodiments designed for cellular applications (W-CDMA and GSM) have shown excellent performance with output power in Watt levels and efficiencies above 40%. Even when the operational frequency was pushed to the K-band (e.g., 35 GHz), high output power (close to 1 W) and high efficiency (close to 40%) were achieved.

Figure 10:
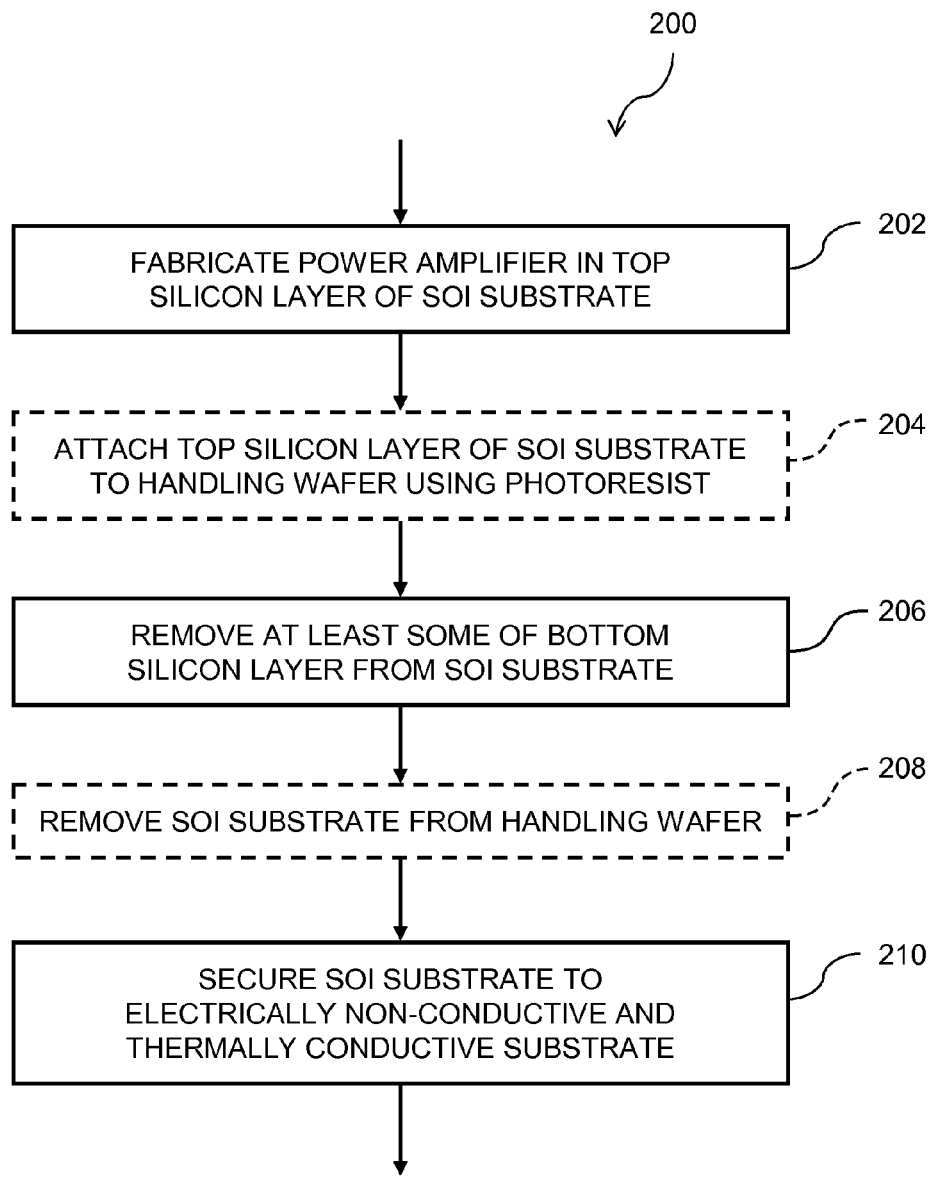
FIG. 10 illustrates one embodiment of a method that may be used to reduce parasitic capacitances in a power amplifier.
Figure 11A:
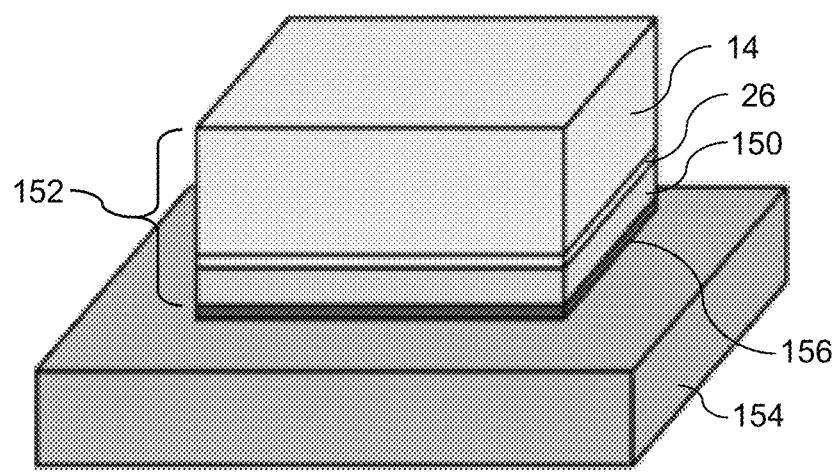
FIG. 11A illustrates one intermediate product of the method of FIG. 10.
Figure 11B:
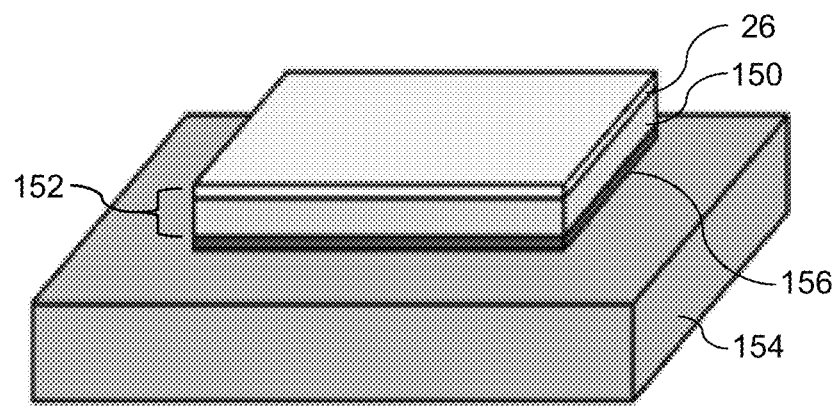
FIG. 11B illustrates another intermediate product of the method of FIG. 10.
Figure 11C:
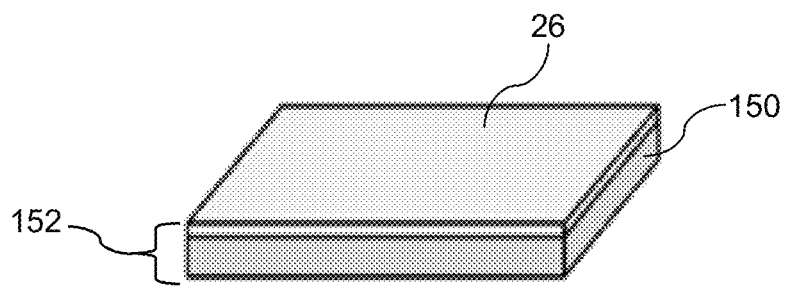
FIG. 11C illustrates another intermediate product of the method of FIG. 10.
Figure 11D:
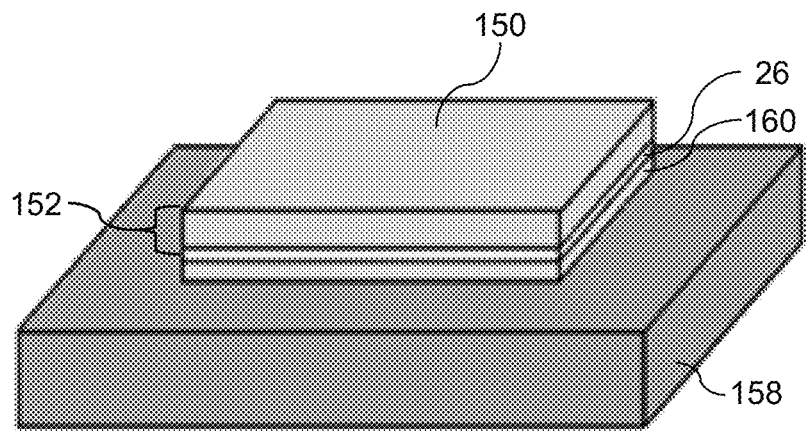
FIG. 11D illustrates a final product of the method of FIG. 10.

Yet another approach to addressing the issue of parasitic capacitances (discussed above with reference to FIGS. 4-6) is illustrated in FIGS. 10-11D. In particular, FIG. 10 is a simplified flow diagram showing one illustrative embodiment of a method 200 that may be used to reduce parasitic capacitances, while FIGS. 11A-D show various illustrative intermediate and final products of the method 200. It will be appreciated that the method 200 may include additional and/or different steps than those shown in FIG. 10, in other embodiments. As described below, in some embodiments, the method 200 may be employed as a post-processing technology to improve the performance of a power amplifier fabricated using a standard CMOS process (e.g., a 45 nm SOI CMOS process).

The method 200 begins with block 202 in which a power amplifier is fabricated in a top Si layer 150 of an SOI substrate 152. As described above (with reference to FIG. 1B), the SOI substrate 152 may include a bottom Si layer (or bulk Si body) 14, a BOX layer 26, and the top Si layer 150. The BOX layer 26 is disposed between the bottom and top Si layers 14, 150 and electrically isolates the bottom and top Si layers 14, 150 from one another. The power amplifier fabricated in block 202 may be formed in the top Si layer 150 of the SOI substrate 152 using any standard, or yet to be developed, SOI CMOS process(es). For instance, in one illustrative embodiment, the power amplifier may be formed using an SOI CMOS process that results in transistors 12 with a thin gate oxide 22, for example, a gate oxide thickness ($t_{OX}$) of ~1 nm. The power amplifier fabricated in block 202 may have any suitable design, including, but not limited to, a design similar to any one of the power amplifiers 30, 40, 50, 60, 70, 80, 90, 100, 110, 120, 130, 140 disclosed herein. In other words, the power amplifier fabricated in block 202 may include series stack of electrically isolated, dynamically biased transistors 12. In some embodiments, the transistors 12 of the power amplifier fabricated in block 202 may be arranged as a plurality of cascode amplifier cells (as described above).

After block 202, the method 200 may optionally proceed to block 204 in which the top Si layer 150 (including the power amplifier) is attached to a handling wafer 154 using photoresist 156. In other words, the SOI substrate 152 is turned upside down, and a layer of photoresist 156 is used to temporarily secure the top Si layer 150 to the handling wafer 154. When block 204 is used, the handling wafer 154 may assist with processing of the SOI substrate 152 during subsequent portions of the method 200, as described below. While the bottom Si layer 14 remains exposed, the photoresist 156 used to attach the top Si layer 150 to the handling wafer 154 may cover and protect the power amplifier. FIG. 11A shows one illustrative intermediate product of block 204, with the top Si layer 150 of the SOI substrate 152 attached to the handling wafer 154.

After block 204 (or after block 202, in embodiments not using block 204), the method 200 proceeds to block 206 in which at least some of the bottom Si layer 14 is removed from the SOI substrate 152. In some embodiments of the method 200, block 206 may involve removing all of the bottom Si layer 14 from the SOI substrate 152. Partially removing the bottom Si layer 14 will reduce the thermal resistance of the SOI substrate 152, while entirely removing the bottom Si layer 14 will eliminate the parasitic capacitances in the power amplifier formed in the top Si layer 150. In some embodiments, block 206 may involve dry etching the bottom Si layer 14. By way of example, some or all of the bottom Si layer 14 may be removed using a xenon difluoride ($XeF_2$) dry etching process with an etch rate of 5 μm/min. As dry etching using $XeF_2$ may be performed at room temperature and in the absence of any plasma, this process may preserve the performance of the power amplifier formed in the top Si layer 150. This process also has high selectivity between Si and silicon dioxide (e.g., 1000:1 selectivity), allowing the etching to stop at the BOX layer 26 of the SOI substrate 152. In one illustrative embodiment (where all of the bottom Si layer 14 is removed, leaving only the top Si layer 150 and the BOX layer 26), the SOI substrate 152 may have a thickness of ~10 μm after block 206. FIG. 11B shows one illustrative intermediate product of block 206, after all of the bottom Si layer 14 has been removed from the SOI substrate 152.

After block 206, the method 200 may optionally proceed to block 208 in which the remaining portion of SOI substrate 152 is removed from the handling wafer 154. In some embodiments, block 206 may involve dissolving the photoresist 156 that was used to attach the SOI substrate 152 to the handling wafer 154 (in block 204) using acetone. FIG. 11C shows one illustrative intermediate product of block 208, after the remaining portion of the SOI substrate 152 (e.g., the top Si layer 150 and the BOX layer 26) has been removed from the handling wafer 154.

After block 208 (or after block 206, in embodiments not using blocks 204 and 208), the method 200 proceeds to block 210 in which the remaining portion of the SOI substrate 152 is secured to an electrically non-conductive (i.e., semi-insulating) and thermally conductive substrate 158. Any material with suitable properties may be used as the substrate 158. In some embodiments, block 210 may involve securing the remaining portion of the SOI substrate 152 to an aluminum nitride (AlN) substrate 158. In embodiments of the method 200 in which all of the bottom Si layer 14 is removed from the SOI substrate 152 (in block 206), block 210 may involve securing the BOX layer 26 of the SOI substrate 152 to the AlN substrate 158. In some embodiments, block 210 may involve bonding the SOI substrate 152 to the AlN substrate 158 using an adhesive layer 160. By way of example, the adhesive layer 160 may comprise polymethyl methacrylate (PMMA), benzocyclobutene (BCB), or other similar materials. In one illustrative embodiment, a thin adhesive layer (e.g., ~100 nm) of PMMA may be applied between the SOI substrate 152 and the AlN substrate 158 (with no air gaps) and cured at 80° C. (e.g., on a heat plate). In other embodiments of the method 200, block 210 may involve depositing AlN on a side of the SOI substrate 152 opposite the power amplifier (i.e., opposite the top Si layer 150) to form the AlN substrate 158. For instance, block 210 may involve depositing AlN using a low temperature deposition process, such as pulsed laser deposition. FIG. 11D shows one illustrative product of block 210 (and the method 200), with the BOX layer 26 of the SOI substrate 152 secured to the AlN substrate 158 using the adhesive layer 160.

The method 200 may be used to reduce the adverse effect of parasitic capacitances in the power amplifier formed in the top Si layer 150 (without the need to include parallel inductors 72, as described above with reference to FIGS. 5A-6, which may reduce amplifier bandwidth and increase chip area). Instead, by substituting some or all of the conductive bottom Si layer 14 with the semi-insulating AlN substrate 158 (using the method 200), all parasitic capacitances will be in series with very large resistors, effectively eliminating their adverse effects on the power amplifier. The higher thermal conductivity (k=285 W/m·K) and lower dielectric constant ($\epsilon_o$=8.9) of the AlN substrate 158, as compared to Si (k=145 W/m·K, $\epsilon_o$=11.68), combined with its semi-insulating characteristics, make the AlN substrate 158 well-suited for implementing RF power circuits.

Referring now to FIGS. 12A-F, various characteristics of a power amplifier were tested both before and after the method 200 was performed (in this embodiment, before and after the entire bottom Si layer 14 of the SOI substrate 152 was removed and replaced with the AlN substrate 158). For these tests, the power amplifier fabricated in the top Si layer 150 of the SOI substrate 152 had a similar design to the power amplifier 50 of FIG. 3C, with sixteen transistors 12 making up the series stack (arranged in pairs as eight cascode amplifier cells 52). In each of the graphs of FIGS. 12A and 12C-F, test data concerning the power amplifier prior to the method 200 being performed is denoted "Si Substrate," and test data concerning the power amplifier after the method 200 was performed is denoted "AlN Substrate."

Figure 12A:
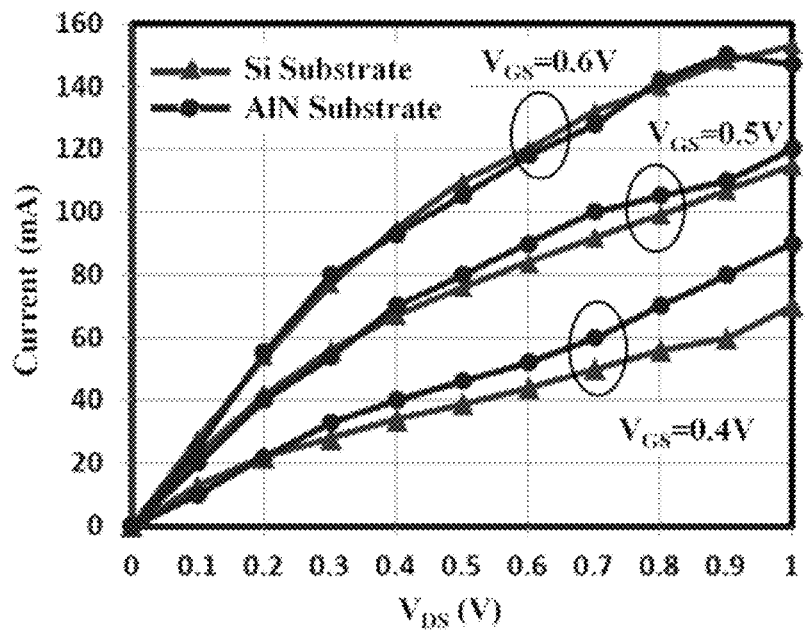
FIG. 12A illustrates $I_D$-$V_{DS}$ characteristics of a transistor, both before and after the method of FIG. 10 was performed.

FIG. 12A illustrates $I_D$-$V_{DS}$ characteristics of a 640 µm NMOS transistor 12 (with a finger width of 0.5 µm) implemented in a 45 nm SOI CMOS technology, both before and after transfer to the AlN substrate 158. As can been seen in the graph of FIG. 12A, no performance degradation of the transistor 12 was observed after transfer to the AlN substrate 158. Small-signal S-parameters of the transistor 12 were also measured before and after transfer to the AlN substrate 158, and no degradation in the RF performance was observed.

Figure 12B:
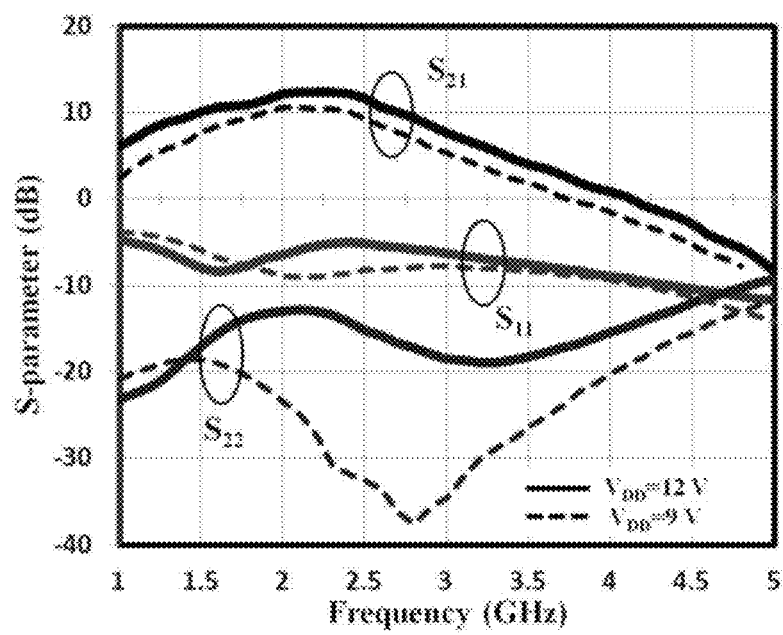
FIG. 12B illustrates small signal S-parameters of a power amplifier after the method of FIG. 10 was performed.

One concern in implementing power amplifiers in SOI CMOS technology is the transistor self-heating effect caused by power dissipated in the transistor and low thermal layer. Transistor power gain typically degrades over time when transistors are operated at high bias currents and high drain voltages. In the particular SOI CMOS technology used for these tests, the maximum voltage difference permitted across drain-source terminals of a transistor is about 1.2V at 105° C. As such, a maximum supply voltage of 15V was selected to ensure that the root-mean-square (RMS) voltages across transistor terminals would be within the safe operating range. Additionally, the power amplifier was designed to operate at a low current density of 0.2 mA/µm to avoid high junction temperatures (>105° C.) across any transistor. On-wafer small-signal S-parameter measurements were performed using a 67 GHz Agilent E8361A network analyzer with short-open-load-thru (SOLT) calibration from 1 to 5 GHz. As shown in the graph of FIG. 12B, the power amplifier (after transfer to the AlN substrate 158) provides a small signal power gain of 12.2 dB at 1.8 GHz, with −3 dB bandwidth from 1.5 to 2.6 GHz, when biased under $V_{DD}$=12V. The gain of the power amplifier is slightly smaller when biased under $V_{DD}$=9V, primarily due to smaller drain current flowing in each transistor 12. The power amplifier transferred to the AlN substrate 158 is unconditionally stable over the entire operating frequency, as indicated by the stability factor (k>1.5).

Figure 12C:
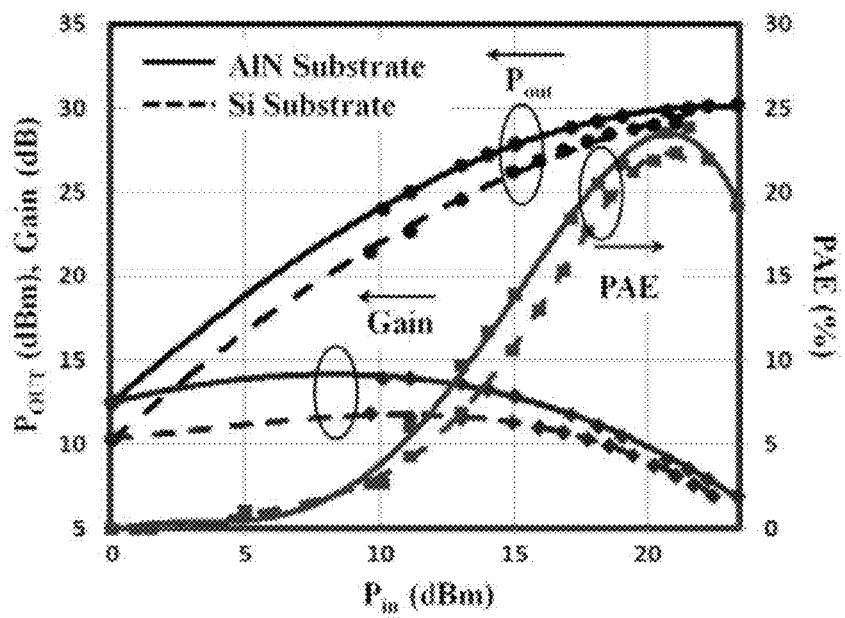
FIG. 12C illustrates the relationship between input power and the large signal performance of a power amplifier, both before and after the method of FIG. 10 was performed.
Figure 12D:
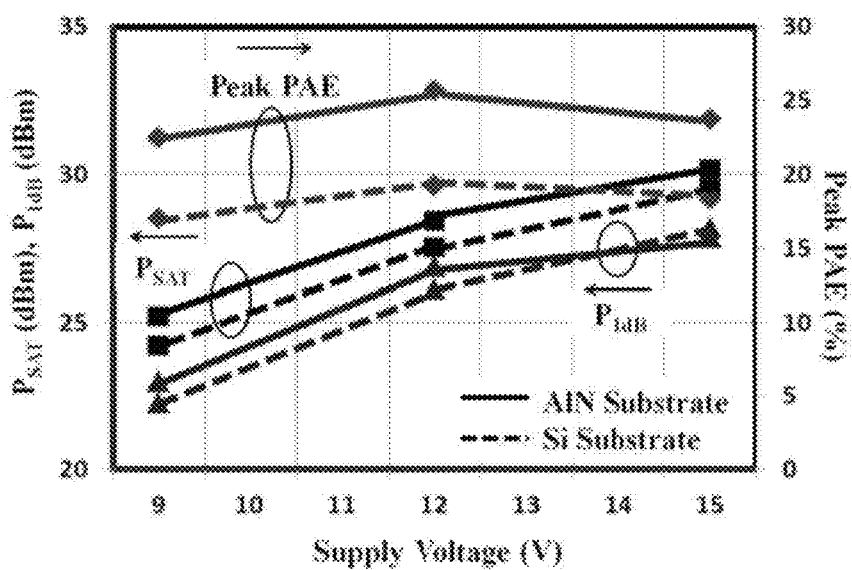
FIG. 12D illustrates the relationship between supply voltage and the large signal performance of a power amplifier, both before and after the method of FIG. 10 was performed.
Figure 12E:
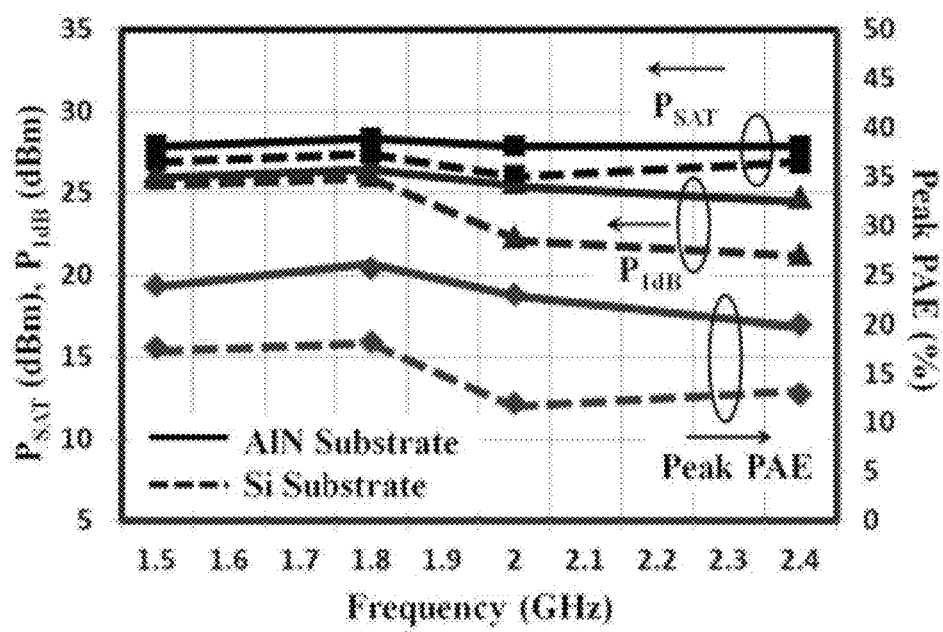
FIG. 12E illustrates the relationship between frequency and the large signal performance of a power amplifier, both before and after the method of FIG. 10 was performed.

The large signal performance of the power amplifier was measured using an Agilent 8722ES spectrum analyzer, with input power provided from an Agilent 83640L CW signal generator. The graph of FIG. 12C compares the power measurement results for the power amplifier before and after transfer to the AlN substrate 158. As described above, transferring the power amplifier to the AlN substrate 158 reduces the adverse effects of parasitic capacitance and, thus, boosts both output power and PAE. After transfer to the AlN substrate 158, the power amplifier delivered a $P_{SAT}$ of 30.2 dBm, a $P_{1\,dB}$ of 27.8 dBm, and a peak PAE of 23.8% at 1.8 GHz, as illustrated in FIG. 12C. The performance effect of varying the supply voltage is illustrated in FIG. 12D, where measured $P_{SAT}$, $P_{1\,dB}$, and peak PAE of the power amplifier (both before and after transfer to the AlN substrate 158), operating at 1.8 GHz, are plotted against the supply voltage. As shown in FIG. 12D, for the power amplifier transferred to the AlN substrate 158, increasing the supply voltage from 9V to 15V increases $P_{SAT}$ from 25.5 to 30.2 dBm, while the peak PAE remains between 23.5% and 25.7% (similar observations were made for the power amplifier before transfer to the AlN substrate 158, but with slightly degraded performance). It will be appreciated that the bias current is controlled by the dynamic-biasing scheme of the power amplifier, which ensures that both linearity and efficiency do not degrade as the supply voltage varies. FIG. 12E illustrates the measured $P_{SAT}$, $P_{1\,dB}$, and PAE versus frequency from 1.5 to 2.4 GHz, with $V_{DD}$=12V, for the power amplifier both before and after transfer to the AlN substrate 158. For the power amplifier transferred to the AlN substrate 158, $P_{SAT}$ and $P_{1\,dB}$ are above 27.9 dBm and 24.8 dBm, respectively, with peak PAE above 20% for the measured frequency range of 1.5 to 2.4 GHz (similar observations were made for the power amplifier before transfer to the AlN substrate 158, but with slightly degraded performance attributed to parasitic capacitances).

Figure 12F:
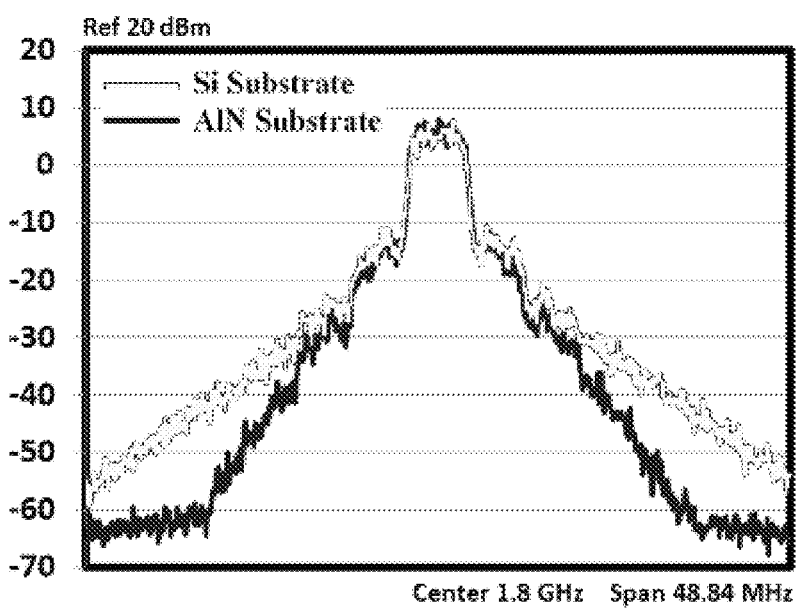
FIG. 12F illustrates wideband code division multiple access (WCDMA) output spectra at 1.8 GHz for a power amplifier, both before and after the method of FIG. 10 was performed.

The power amplifier was also measured using a WCDMA signal, with a chip rate of 3.84 Mcps, provided by an Agilent E4433B series signal generator. The adjacent channel leakage ratio (ACLR) was measured at 5 MHz and 10 MHz offsets from a center frequency of 1.8 GHz. FIG. 12F compares the measured ACLR (at the saturated output power) before and after the power amplifier was transferred to the AlN substrate 158. As transfer to the AlN substrate 158 reduces or eliminates the adverse effects of parasitic capacitances, the method 200 improves the overall linearity of the power amplifier. As illustrated in FIG. 12F, for the power amplifier transferred to the AlN substrate 158, ACLR of −40.6 and −54.2 were measured at 5 MHz and 10 MHz offsets, respectively. An improvement of 2 dB to 4 dB was observed, after the power amplifier was transferred to the AlN substrate 158.

A CMOS power transistor may experience thermal runaway under high power operation. This phenomenon may be attributed to a shift in the threshold voltage of the CMOS transistor with increased junction temperature. In a CMOS transistor with multiple fingers, thermal runaway typically starts from the hottest finger of the CMOS transistor. The local threshold voltage of the hottest finger decreases as temperature increases. This decreased threshold voltage causes more current to pass through the hottest finger, leading to higher dissipated power and even higher temperatures across that finger. This cycle of higher currents and higher temperatures (i.e., thermal runaway) may continue until metallization attached to the hottest finger melts. After this partial burnout, the transconductance of the CMOS transistor is decreased, leading to reduced RF gain. If the partial burnout of one or more fingers leads to higher junction temperatures across additional fingers, the entire CMOS transistor may experience burnout.

Figure 13:
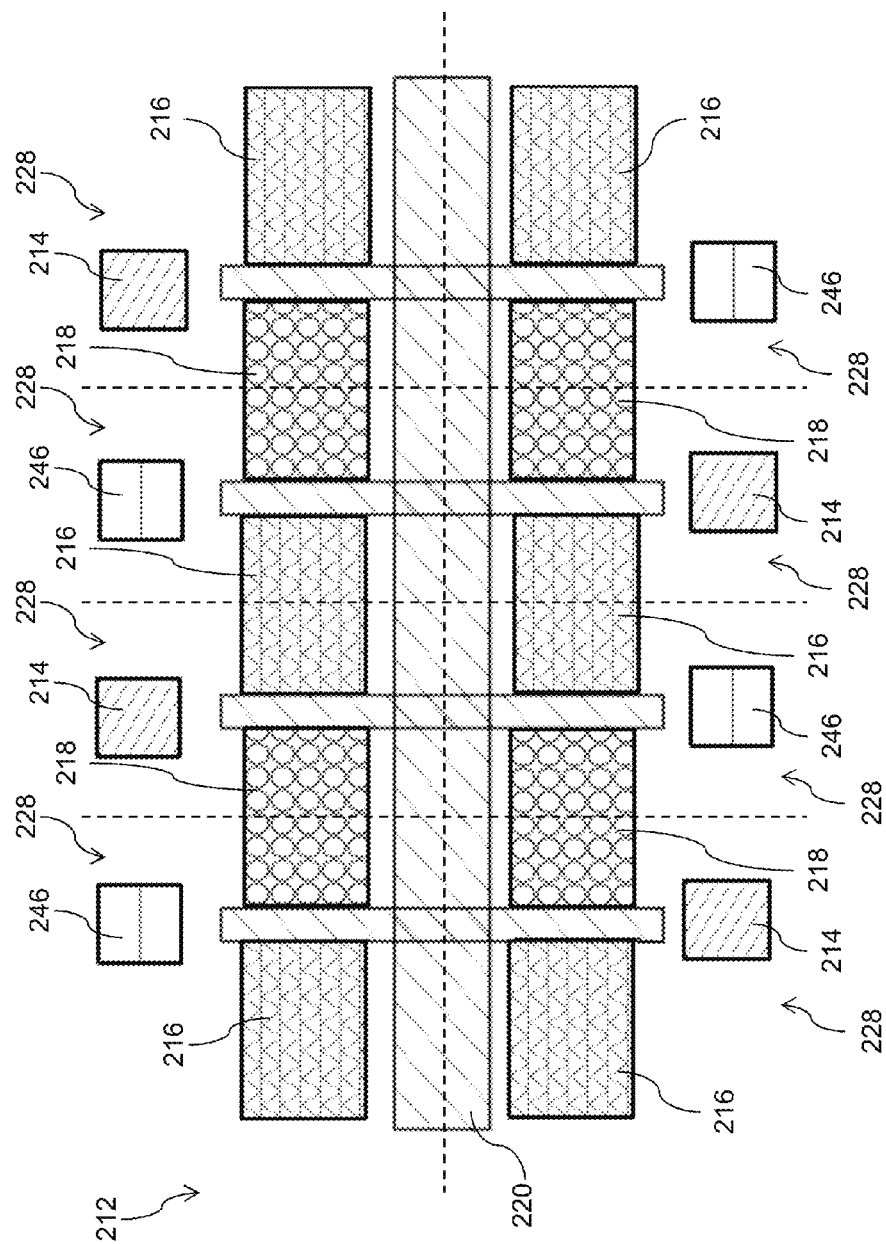
FIG. 13 illustrates one embodiment of a power transistor with temperature stabilization.

Referring now to FIG. 13, one illustrative embodiment of a CMOS transistor 212 including multiple fingers 228 is shown. In some embodiments, the transistor 212 may be an SOI CMOS transistor 212. While the transistor 212 is illustrated in FIG. 13 with eight fingers 228, it is contemplated that the transistor 212 may include any number of fingers 228 in other embodiments. Each of the fingers 228 of the transistor 212 includes a portion of a source region 216, a portion of a drain region 218, and a portion of a gate 220 positioned over a channel region (with a gate oxide between the gate 220 and the channel region). To prevent thermal runaway, the transistor 212 includes a number of body terminals 214 and a number of PN junction temperature sensors 246 positioned around the transistor 212. As shown in FIG. 13, the illustrative embodiment of the transistor 212 includes one body terminal 214 and one PN junction temperature sensor 246 for every two fingers 228 of the transistor 212 (positioned in an alternating fashion around the transistor 212). It is contemplated that, in other embodiments, the transistor 212 may include any number of body terminals 214 and any number of PN junction temperature sensors 246, arranged in various configurations.

Figure 14:
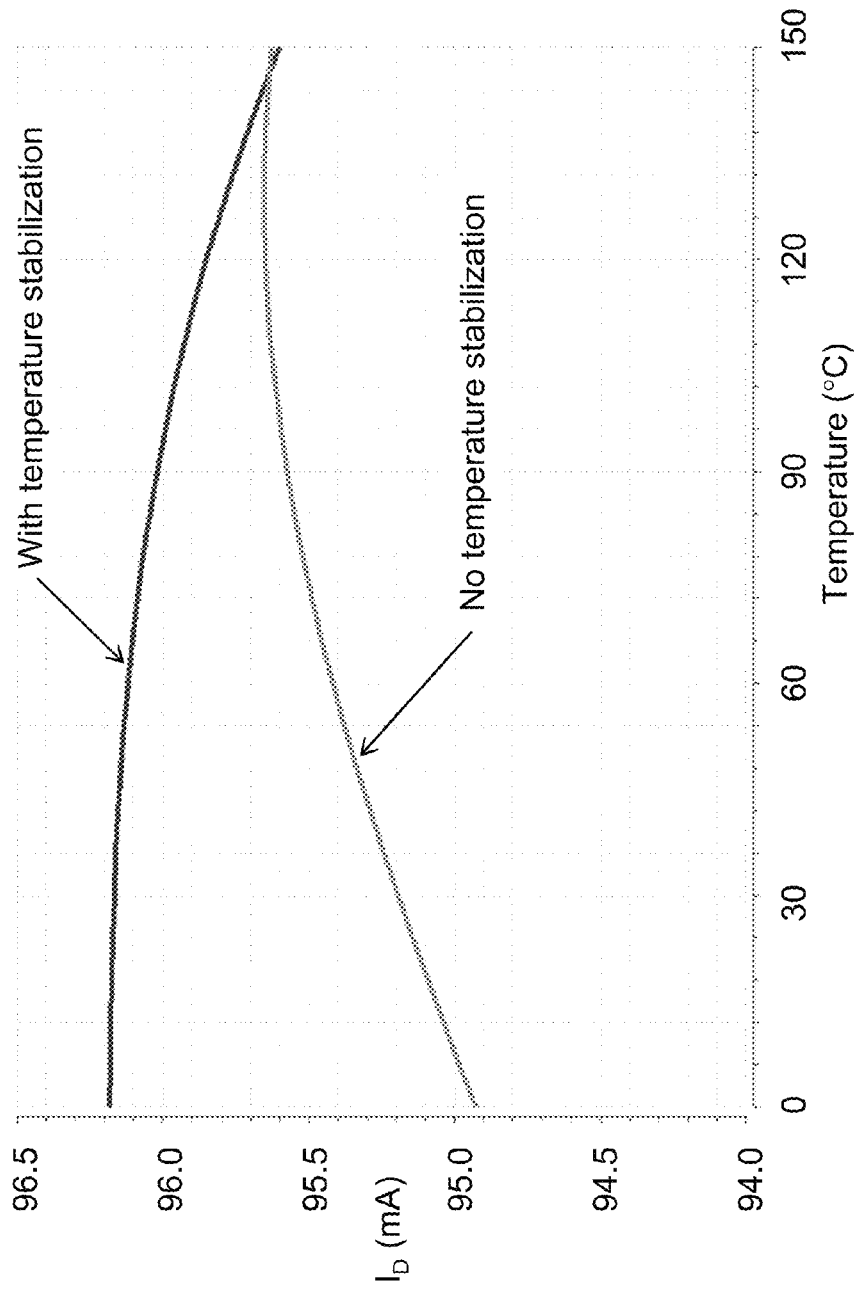
FIG. 14 illustrates simulation results of drain current versus junction temperature for the power transistor of FIG. 13 and for a similar transistor without temperature stabilization.

In operation, each of the PN junction temperature sensors 246 detect temperatures of the fingers 228 of the transistor 212 near that PN junction temperature sensor 246. If the temperature of a particular finger 228 exceeds a threshold value (e.g. a temperature representing the onset of thermal runaway), a bias voltage may be applied to the body terminal 214 close to that finger 228, thereby stabilizing the local threshold voltage of that finger 228 and preventing thermal runaway. FIG. 14 illustrates simulation results comparing drain current versus junction temperature for the transistor 212 (with temperature stabilization) and a similar transistor with no temperature stabilization. The negative slope of the graph line for the transistor 212 in FIG. 14 signifies that thermal runaway is prevented. The foregoing thermal stabilization approach may result in a more uniform current across the fingers 228, which may lead to higher overall current for the transistor 212 and to higher power performance for a power amplifier incorporating the transistor 212. It will be appreciated that transistors using this thermal stabilization approach may be incorporated into any of the power amplifier designs disclosed herein.

While the disclosure has been illustrated and described in detail in the drawings and foregoing description, such an illustration and description is to be considered as exemplary and not restrictive in character, it being understood that only illustrative embodiments have been shown and described and that all changes and modifications that come within the spirit of the disclosure are desired to be protected. There are a plurality of advantages of the present disclosure arising from the various features of the apparatus, systems, and methods described herein. It will be noted that alternative embodiments of the apparatus, systems, and methods of the present disclosure may not include all of the features described yet still benefit from at least some of the advantages of such features. Those of ordinary skill in the art may readily devise their own implementations of the apparatus, systems, and methods that incorporate one or more of the features of the present invention and fall within the spirit and scope of the present disclosure as defined by the appended claims.

The invention claimed is:

1. A method comprising:
fabricating a power amplifier in a first silicon layer of a silicon-on-insulator (SOI) substrate, wherein the SOI substrate comprises the first silicon layer, a second silicon layer, and a buried oxide layer disposed between the first and second silicon layers;
removing at least some of the second silicon layer from the SOI substrate, after fabricating the power amplifier; and
securing the SOI substrate, after removing at least some of the second silicon layer, to an electrically non-conductive and thermally conductive substrate;
wherein the power amplifier comprises:
a plurality of transistors formed in the first silicon layer of the SOI substrate such that the plurality of transistors are each electrically isolated from one another within the SOI substrate; and
a plurality of biasing networks, each biasing network being configured to dynamically bias at least one of the plurality of transistors;
wherein the plurality of transistors are electrically coupled in a series stack and an output of the power amplifier is provided across the series stack.

2. The method of claim 1, wherein securing the SOI substrate to the electrically non-conductive and thermally conductive substrate comprises securing the SOI substrate to an aluminum nitride (AlN) substrate.

3. A method, comprising:
fabricating a power amplifier in a first silicon layer of a silicon-on-insulator (SOI) substrate, wherein the SOI substrate comprises the first silicon layer, a second silicon layer, and a buried oxide layer disposed between the first and second silicon layers;

removing all of the second silicon layer from the SOI substrate, after fabricating the power amplifier; and securing the buried oxide layer of the SOI substrate, after removing all of the second silicon layer, to an aluminum nitride (AlN) substrate.

4. The method of claim 2, wherein securing the SOI substrate to the AlN substrate comprises bonding the SOI substrate to the AlN substrate using an adhesive layer.

5. The method of claim 2, wherein securing the SOI substrate to the AlN substrate comprises depositing AlN on a side of the SOI substrate opposite the power amplifier.

6. A method, comprising:

fabricating a power amplifier in a first silicon layer of a silicon-on-insulator (SOI) substrate, wherein the SOI substrate comprises the first silicon layer, a second silicon layer, and a buried oxide layer disposed between the first and second silicon layers;

removing at least some of the second silicon layer from the SOI substrate, after fabricating the power amplifier; and securing the SOI substrate, after removing at least some of the second silicon layer, to an aluminum nitride (AlN) substrate by depositing AlN on a side of the SOI substrate opposite the power amplifier using pulsed laser deposition.

7. The method of claim 1, further comprising attaching the first silicon layer to a handling wafer using photoresist, after fabricating the power amplifier and prior to removing at least some of the second silicon layer.

8. The method of claim 7, wherein removing at least some of the second silicon layer comprises dry etching the second silicon layer using xenon difluoride.

9. The method of claim 1, wherein the power amplifier comprises a plurality of cascode amplifier cells each including at least two of the plurality of transistors, at least one transistor of each of the plurality of cascode amplifier cells being arranged in a common-gate configuration.

* * * * *